United States Patent [19]
Kimura

[11] Patent Number: 5,933,054
[45] Date of Patent: Aug. 3, 1999

[54] BIPOLAR OPERATIONAL TRANSCONDUCTANCE AMPLIFIER

[75] Inventor: Katsuji Kimura, Tokyo, Japan

[73] Assignee: NEC Corporation, Tokyo, Japan

[21] Appl. No.: 08/716,539

[22] Filed: Sep. 19, 1996

[30] Foreign Application Priority Data

Sep. 19, 1995 [JP] Japan .................................. 7-264947

[51] Int. Cl.$^6$ ...................................................... H03F 3/45
[52] U.S. Cl. ........................................ 330/254; 330/261
[58] Field of Search .................................. 330/252, 254, 330/261

[56] References Cited

U.S. PATENT DOCUMENTS

| | | | |
|---|---|---|---|
| 4,723,110 | 2/1988 | Voorman | 330/252 |
| 4,992,757 | 2/1991 | Shin'e | 330/254 |
| 5,481,224 | 1/1996 | Kimura . | |
| 5,485,119 | 1/1996 | Kimura . | |
| 5,500,623 | 3/1996 | Kimura . | |
| 5,512,855 | 4/1996 | Kimura . | |
| 5,521,542 | 5/1996 | Kimura . | |
| 5,561,392 | 10/1996 | Kimura . | |
| 5,578,965 | 11/1996 | Kimura . | |
| 5,581,211 | 12/1996 | Kimura . | |

FOREIGN PATENT DOCUMENTS

| | | | |
|---|---|---|---|
| 0344855 | 12/1989 | European Pat. Off. . | |
| 0603942 | 6/1994 | European Pat. Off. . | |
| 57-81712 | 5/1982 | Japan | 330/254 |
| 2195211 | 3/1988 | United Kingdom . | |

OTHER PUBLICATIONS

J. Schmoock, "An Input Stage Transconductance Reduction Technique for High–Slew Rate Operational Amplifiers", IEEE Journal of Solid–State Circuits, vol. SC–10, No. 6, Dec. 1975, pp. 407–411.

H. Tanimoto, et al., "Realization of a 1–V Active Filter Using a Linearization Technique Employing Plurality of Emitter–Coupled Pairs", IEEE Journal of Solid–State Circuits, vol. 26, No. 7, Jul. 1991, pp. 937–945.

*Primary Examiner*—James B. Mullins
*Attorney, Agent, or Firm*—Sughrue, Mion, Zinn, Macpeak & Seas, PLLC

[57] ABSTRACT

A bipolar OTA having a wide input voltage range is provided without increasing the circuit scale and current consumption. This OTA includes a first differential pair of emitter-coupled first and second bipolar transistors, a second differential pair of emitter-coupled third and fourth bipolar transistors, a common current source or sink connected to the coupled emitters of the first to fourth transistors. The first to fourth transistors are driven by a common tail current produced by the common current source or sink. A first input voltage as an input signal to be amplified is differentially applied across the bases of the first and second transistors. A second input voltage, which is produced by attenuating the first input voltage, is differentially applied across the bases of the third and fourth transistors. First and second dc offset voltages are applied to the bases of the third and fourth transistors, respectively. An output current as an amplified output signal is differentially derived from collectors of the first and second transistors. A fifth bipolar transistor driven by the common current source or sink may be additionally used for applying a third input voltage.

29 Claims, 16 Drawing Sheets

5,933,054

BIPOLAR OPERATIONAL TRANSCONDUCTANCE AMPLIFIER

BACKGROUND OF THE INVENTION

1. Field of the Invention

The present invention relates to a differential amplifier circuit comprised of bipolar transistors and more particularly, to a differential amplifier circuit having an improved transconductance linearity within a wide input voltage range, which is formed on a bipolar semiconductor integrated circuit device and is operable at a low supply voltage.

2. Description of the Prior Art

A differential amplifier circuit having a superior transconductance linearity within a comparatively wide input voltage range has been known as an "Operational Transconductance Amplifier (OTA)".

An example of the conventional bipolar OTAs was disclosed by Schmook in the IEEE Journal of Solid-State Circuits, Vol. SC-10, No. 6, PP. 407–411, December 1975, in which two unbalanced differential pairs of bipolar transistors are employed. Two transistors of each pair has different emitter areas or sizes. Output ends or collectors of the two transistors of each pair are cross-coupled.

The transconductance linearization technique proposed by Schmook is known as the "Multi-tanh" technique, and has been practically used.

An application of this Multi-tanh technique was disclosed y Tanimoto et al., in IEEE Journal of Solid-State Circuits, Vol. 26, No. 7, PP. 937–945, July 1991.

FIG. 1 shows a conventional bipolar OTA of this sort, which contains first to (2N+1)-th differential pairs of npn bipolar transistors and first to (2N+1)-th constant current sinks.

As shown in FIG. 1, a first differential pair is made of npn bipolar transistors Q01 and Q02 whose emitter areas are equal to that of a unit bipolar transistor. Emitters of the transistors Q01 and Q02 are commonly connected to one end of a first constant current sink CS0 (current: $I_{00}$). The other end of the current sink CS0 is grounded. Bases of the transistors Q01 and Q02 are connected to first and second input terminals T1 and T2, respectively.

A second differential pair is made of npn bipolar transistors Q11 and Q12 whose emitter areas are different. The emitter area of the transistors Q11 is equal to that of a unit bipolar transistor. The emitter area of the transistors Q12 is $K_1$ times as much as that of a unit bipolar transistor, where $K_1$ is greater than unity. Emitters of the transistors Q11 and Q12 are commonly connected to one end of a second constant current sink CS1 (current: $I_{01}$) The other end of the current sink CS1 is grounded. Bases of the transistors Q11 and Q12 are connected to the first and second input terminals T1 and T2, respectively.

A third differential pair is made of npn bipolar transistors Q11' and Q12' whose emitter areas are different. The emitter area of the transistor Q11' is equal to that of a unit bipolar transistor. The emitter area of the transistors Q12' is $K_1$ times as much as that of a unit bipolar transistor. Emitters of the transistors Q11' and Q12' are commonly connected to one end of a third constant current sink CS1' (current: $I_{01}$) The other end of the current sink CS1' is grounded. Bases of the transistors Q11' and Q12' are connected to the first and second input terminals T2 and T1, respectively.

Collectors of the transistors Q11 and Q12' are coupled together. A collector of the transistor Q01 is connected to the coupled collectors of the transistors Q11 and Q12'. Collectors of the transistors Q11' and Q12 are coupled together. A collector of the transistor Q02 is connected to the coupled collectors of the transistors Q11' and Q12.

Similarly, a 2N-th differential pair is made of npn bipolar transistors QN1 and QN2 whose emitter areas are different. The emitter area of the transistor QN1 is equal to that of a unit bipolar transistor. The emitter area of the transistors QN2 is $K_N$ times as much as that of a unit bipolar transistor, where $K_N$ is greater than unity. Emitters of the transistors QN1 and QN2 are commonly connected to one end of an 2N-th constant current sink CSN (current: $I_{ON}$). The other end of the current sink CSN is grounded. Bases of the transistors QN1 and QN2 are connected to the first and second input terminals T1 and T2, respectively.

A (2N+1)-th differential pair is made of npn bipolar transistors QN1' and QN2' whose emitter areas are different. The emitter area of the transistor QN1' is equal to that of a unit bipolar transistor. The emitter area of the transistors QN2' is $K_N$ times as much as that of a unit bipolar transistor. Emitters of the transistors QN1' and QN2' are commonly connected to one end of an (2N+1)-th constant current sink CSN' (current: $I_{ON}$). The other end of the current sink CSN' is grounded. Bases of the transistors QN1' and QN2' are connected to the first and second input terminals T2 and T1, respectively.

Collectors of the transistors QN1 and QN2' are coupled together. Collectors of the transistors QN1' and QN2 are coupled together.

The collector of the transistor Q1 and the coupled collectors of the transistors Q11, Q12', . . . , QN1' and QN2' are further coupled together, thereby forming one of differential output ends of this conventional OTA. The collector of the transistor Q2 and the coupled collectors of the transistors Q12, Q11', . . . , QN2 and QN1' are coupled together, thereby forming the other of the differential output ends of this conventional OTA.

A differential input voltage $V_1$ as an input signal to be amplified is applied across the first and second input terminals T1 and T2. A differential output current $\Delta I$ as an amplified output signal is derived from the differential output ends.

Here, it is supposed that all the transistors Q01 through QN2' are matched in characteristic and that the base-width modulation (i.e., the Early voltage) is ignored.

For a j-th differential pair of two bipolar emitter-coupled transistors which are driven by a common constant current $I_{oj}$ and which have emitter areas in the ratio of $K_j$: 1 ($K_j$ is equal to or greater than unity) with respect to a unit bipolar transistor, collector currents $I_{C1j}$ and $I_{C2j}$ of the two transistors are expressed as the following equations (1a) and (1b), respectively.

$$I_{C1j} = I_S \exp\left(\frac{V_{BE1j}}{V_T}\right) \tag{1a}$$

$$I_{C2j} = K_j I_S \exp\left(\frac{V_{BE2j}}{V_T}\right) \tag{1b}$$

In the equations (1a) and (1b), $V_{BE1j}$ and $V_{BE2j}$ are base-to-emitter voltages of the two transistors, respectively, and $I_s$ the saturation current thereof. $V_T$ is the thermal voltage defined as $V_T = kT/q$, where k is the Boltzmann's constant, T is absolute temperature in degrees Kelvin, and q is the charge of an electron.

When the differential input voltage $V_1$ is applied across the bases of the two transistors of the j-th differential pair, the following equation (1c) is established around the loop consisting of the input voltage and the two base-emitter junctions because of the Kirchhoff's voltage law.

$$V_i - V_{BE1j} + V_{BE2j} = 0 \tag{1c}$$

The equation (1c) is rewritten by substituting the above equations (1a) and (1b) into the equation (1c) as the following equation (1d):

$$V_i - V_T \ln\left(\frac{I_{C1j}}{I_S}\right) + V_T \ln\left(\frac{I_{C2j}}{K_j I_S}\right) = 0 \tag{1d}$$

On the other hand, the following relationship (1e) is satisfied among the collector currents $I_{C1j}$ and $I_{C2j}$ and the constant driving current $I_{0j}$.

$$I_{C1j} + I_{C2j} = \alpha_F I_{0j} \tag{1e}$$

where $\alpha_F$ is a dc common-base current gain factor.

Therefore, the collector currents $I_{C1j}$ and $I_{C2j}$ are expressed as the following equations (1f) and (1g), respectively:

$$I_{C1j} = \frac{\alpha_F I_{0j}}{1 + \frac{1}{K_j}\exp\left(-\frac{V_i}{V_T}\right)} \tag{1f}$$

$$= \frac{2\alpha_F I_{0j} \exp\left(\frac{V_i + \ln K_j}{2V_T}\right)}{\cosh\left(\frac{V_i + \ln K_j}{2V_T}\right)}$$

$$I_{C2j} = \frac{\alpha_F I_{0j}}{1 + K_j \exp\left(\frac{V_i}{V_T}\right)} \tag{1g}$$

$$= \frac{2\alpha_F I_{0j} \exp\left(-\frac{V_i + \ln K_j}{2V_T}\right)}{\cosh\left(\frac{V_i + \ln K_j}{2V_T}\right)}$$

Accordingly, a differential output current $\Delta I_{Cj}$ of the j-th differential pair, which is defined as $\Delta I_{Cj} = I_{C1j} - I_{C2j}$, is given by the following equation (2) or (3).

$$\Delta I_{Cj} = I_{C1j} - I_{C2j} = \alpha_F I_{0j} \tanh\left(\frac{V_i + V_{Kj}}{2V_T}\right) \tag{2}$$

$$\Delta I_{Cj} = \frac{\alpha_F I_{0j} \sinh\left(\frac{V_i + V_{Kj}}{2V_T}\right)}{\cosh\left(\frac{V_i + V_{Kj}}{2V_T}\right)} \tag{3}$$

In the equations (2) and (3), $V_{Kj}$ is a dc offset voltage between the two transistors of the j-th differential pair, which is defined as $V_{Kj} = V_T \cdot \ln(K_j)$.

It is seen from the equations (2) and (3) that the differential output current $\Delta I_{Cj}$ of the j-th differential pair is expressed by a hyperbolic tangent (tanh) function, in other words, by a fraction whose numerator is a hyperbolic sine (sinh) function and whose denominator is a hyperbolic cosine (cosh) function.

Accordingly, a differential output current $\Delta I$ of the conventional OTA shown in FIG. 1 is expressed as the following equation (4a) or (4b):

$$\Delta I = \alpha_F \sum_{j=0}^{2N} \left\{ I_{0j} \tanh\left(\frac{V_i + V_{Kj}}{2V_T}\right) \right\} \tag{4a}$$

$$\Delta I = \alpha_F \sum_{j=0}^{2N} \left\{ \frac{I_{0j} \sinh\left(\frac{V_i + V_{Kj}}{2V_T}\right)}{\cosh\left(\frac{V_i + V_{Kj}}{2V_T}\right)} \right\} \tag{4b}$$

In the first differential pair of the transistors Q01 and Q02, the emitter areas of the transistors Q01 and Q02 are equal to that of a unit transistor and therefore, the offset voltage $V_{K0}$ is zero, because $V_{K0} = V_T \cdot \ln(1) = 0$.

The name of the "multi-tanH" technique was termed after the form of the equation (4a).

Here, since the offset voltages of the (j−1)-th and j-th differential pairs, which are arranged symmetrically, have the same emitter area ratio, they have a relationship of $V_{Kj} = -V_{Kj-1}$. Therefore, the differential output currents $\Delta I_{Cj}$ and $\Delta I_{Cj-1}$ of these two pairs are expressed as the following equations (5a) and (5b), respectively.

$$\Delta I_{Cj} = \alpha_F I_{0j} \tanh\left(\frac{V_i + V_{Kj}}{2V_T}\right) \tag{5a}$$

$$\Delta I_{Cj-1} = \alpha_F I_{0j} \tanh\left(\frac{V_i + V_{Kj-1}}{2V_T}\right) \tag{5b}$$

$$= \alpha_F I_{0j} \tanh\left(\frac{V_i - V_{Kj}}{2V_T}\right)$$

The collectors of the transistors of the symmetrically-arranged (j−1)-th and j-th differential pairs are coupled together and accordingly, the following equation (6) is established as $$\Delta I_{C2j} = \Delta I_{Cj-1} + \Delta I_{Cj} = \frac{2\alpha_F I_{0j} \sinh\left(\frac{V_i}{V_T}\right)}{\cosh\left(\frac{V_i}{V_T}\right) + \cosh\left(\frac{V_{Kj}}{V_T}\right)} \tag{6}$$

Then, the differential output current $\Delta I$ of the conventional OTA of FIG. 1 is expressed as the following equation (7).

$$\Delta I = \Delta I_{C0} + \sum_{j=1}^{N} \Delta I_{C2j} \tag{7}$$

where $\Delta I_{C0}$ is the differential output current of the first differential pair of the transistors Q01 and Q02.

As a result, the differential output current $\Delta I$ of the conventional OTA of FIG. 1 is expressed as the following general equation (8).

$$\Delta I = \frac{\alpha_F \left[\sum_{j=1}^{N+1} \left\{C_j \sinh\left(\frac{jV_i}{V_T}\right)\right\}\right]}{\sum_{j=1}^{N+1} \left\{B_j \cosh\left(\frac{jV_i}{V_T}\right)\right\}} \tag{8}$$

where $B_j$ and $C_j$ are coefficients.

If the equation (8) is differentiated by the differential input voltage $V_i$, the transconductance characteristic of the conventional OTA of FIG. 1 is given by the following equation (9).

$$\frac{d(\Delta I)}{dV_i} = \frac{\alpha_F}{V_T} \left[ \frac{\sum_{j=1}^{N+1}\left\{jC_j\sinh\left(\frac{jV_i}{V_T}\right)\right\}}{\sum_{j=1}^{N+1}\left\{B_j\cosh\left(\frac{jV_i}{V_T}\right)\right\}} - \frac{\left[\sum_{j=1}^{N+1}\left\{\sinh\left(\frac{jV_i}{V_T}\right)\right\}\right]\left[\sum_{j=1}^{N+1}\left\{jB_j\sinh\left(\frac{jV_i}{V_T}\right)\right\}\right]}{\left[\sum_{j=1}^{N+1}\left\{B_j\cosh\left(\frac{jV_i}{V_T}\right)\right\}\right]^2} \right] \qquad (9)$$

To cause the transconductance to be maximally flat, considering the symmetric arrangement of the differential transistor pairs, the odd-order differential coefficients of the differential output current $\Delta I$ in the equation (8) needs to be zero at $V_i=0$. Specifically, the following condition (10) needs to be satisfied.

$$\left.\frac{d^3(\Delta I)}{dV_i^3}\right|_{V_i=0} = \cdots = \left.\frac{d^{2n+1}(\Delta I)}{dV_i^{2n+1}}\right|_{V_i=0} = 0 \qquad (10)$$

The maximum value of the transconductance shown in the equation (9) is obtained at $V_i=0$. Therefore, the following equation (11) needs to be established.

$$\frac{d(\Delta I)}{dV_i} \le \left.\frac{d(\Delta I)}{dV_i}\right|_{V_i=0} \qquad (11)$$

FIG. 2 shows another conventional bipolar OTA of this sort, which contains first to N-th differential pairs of bipolar transistors and first to N-th constant current sinks As shown in FIG. 2, this OTA has the same configuration as that of the OTA of FIG. 1 except that the first differential pair of the transistors Q01 and Q02 and the corresponding first constant current sink CS0 are canceled.

Accordingly, a differential output current $\Delta I$ of the conventional OTA shown in FIG. 2 is expressed as the following equation (7'), because $\Delta I_{C_0} = 0$ in the equation (7):

$$\Delta I = \sum_{j=1}^{N} \Delta I_{C2j} \qquad (7')$$

As a result, by substituting the above equation (6) into the equation (7'), the differential output current $\Delta I$ of the conventional OTA of FIG. 2 is expressed as the following general equation (8').

$$\Delta I = \frac{\alpha_F\left[\sum_{j=1}^{N}\left\{C_j\sinh\left(\frac{jV_i}{V_T}\right)\right\}\right]}{\sum_{j=1}^{N}\left\{B_j\cosh\left(\frac{jV_i}{V_T}\right)\right\}} \qquad (8')$$

If the equation (8') is differentiated by the differential input voltage $V_i$, the transconductance characteristic of the conventional OTA of FIG. 2 is given by the following equation (9').

$$\frac{d(\Delta I)}{dV_i} = \frac{\alpha_F}{V_T} \left[ \frac{\sum_{j=1}^{N}\left\{jC_j\sinh\left(\frac{jV_i}{V_T}\right)\right\}}{\sum_{j=1}^{N}\left\{B_j\cosh\left(\frac{jV_i}{V_T}\right)\right\}} - \frac{\left[\sum_{j=1}^{N}\left\{\sinh\left(\frac{jV_i}{V_T}\right)\right\}\right]\left[\sum_{j=1}^{N}\left\{jB_j\sinh\left(\frac{jV_i}{V_T}\right)\right\}\right]}{\left[\sum_{j=1}^{N}\left\{B_j\cosh\left(\frac{jV_i}{V_T}\right)\right\}\right]^2} \right] \qquad (9')$$

To cause the transconductance to be maximally flat, considering the symmetric arrangement of the differential transistor pairs, the odd-order differential coefficients of the differential output current $\Delta I$ in the equation (8') needs to be zero at $V_i=0$. The maximum value of the transconductance shown in the equation (9') is obtained at $V_i=0$. Therefore, also in the conventional OTA of FIG. 2, the above condition (10) needs to be satisfied and the above equation (11) needs to be established.

When N=1 (i.e., 2N=2) in the conventional OTA of FIG. 2, this OTA has a circuit configuration shown in FIG. 3. This configuration is termed a "multi-tanh doublet".

The condition of the transconductance to be maximally flat is given by $$\left.\frac{d^3(\Delta I)}{dV_i^3}\right|_{V_i=0} = 0$$

Therefore, the emitter area ratio $K_1$ is given as $$K_1 = 2 \pm \sqrt{3} \quad (\approx 3.73205 \text{ and } 0.267949),$$

and the coefficients $B_0$, $B_1$ and $C_1$ are given as $B_0 = \cosh(\ln K_1) = 2$
$B_1 = 1$ and
$C_1 = 2$.

A differential output current $\Delta I$ of the conventional OTA of FIG. 3 is expressed as the following equation (12):

$$\Delta I = \frac{2\alpha_F I_0 \sinh\left(\frac{V_i}{V_T}\right)}{\cosh\left(\frac{V_i}{V_T}\right)+2} \quad (12)$$

When N=1 (i.e., 2N+1=3) in the conventional OTA of FIG. 1, this OTA has a circuit configuration shown in FIG. 5. This configuration is termed a "multi-tanh triplet".

A differential output current $\Delta I$ of the conventional OTA shown in FIG. 5 is expressed as the following equation (13):

$$\Delta I = \alpha_F \left\{ \frac{I_{00}\sinh\left(\frac{V_i}{2V_T}\right)}{\cosh\left(\frac{V_i}{2V_T}\right)} + \frac{2I_{01}\sinh\left(\frac{V_i}{V_T}\right)}{\cosh\left(\frac{V_i}{V_T}\right)+\cosh\left(\frac{V_{K1}}{V_T}\right)} \right\} \quad (13)$$

The condition of the transconductance to be maximally flat is given by $$\left.\frac{d^3(\Delta I)}{dV_i^3}\right|_{V_i=0} = 0$$

Therefore, the following equation (14) is established.

$$2I_{01} \frac{\cosh\left(\frac{V_{K1}}{V_T}\right)-2}{\left\{\cosh\left(\frac{V_{K1}}{V_T}\right)+1\right\}^2} - \frac{I_{00}}{4} = 0 \quad (14)$$

Further, from the relationship of $$\left.\frac{d^5(\Delta I)}{dV_i^5}\right|_{V_i=0} = 0,$$

the following equation (15) is obtained.

$$2I_{01} \frac{\left\{\cosh\left(\frac{V_{K1}}{V_T}\right)\right\}^2 - 13\cosh\left(\frac{V_{K1}}{V_T}\right)+16}{\left\{\cosh\left(\frac{V_{K1}}{V_T}\right)+1\right\}^3} + \frac{I_{00}}{2} = 0 \quad (15)$$

Therefore, $\cosh(V_{K1}/V_T)=2$ (i.e., $K_1 \approx 7.873$) and $I_{00}=(16/25)I_{01}$ are established. This means that B2=1, B1=2cosh[ln(K_i)+1]=9, B0=0, C2=2.64 and C1=6.48.

As a result, the differential output current $\Delta I$ is given by the following equation (16), where $I_0=I_{01}$.

$$\Delta I = \frac{\alpha_F I_{11}\left\{2.64\sinh\left(\frac{3V_i}{2V_T}\right)+6.48\sinh\left(\frac{V_i}{2V_T}\right)\right\}}{\cosh\left(\frac{3V_i}{2V_T}\right)+9\cosh\left(\frac{V_i}{2V_T}\right)} \quad (16)$$

When N=2 (i.e., 2N=4) in the conventional OTA of FIG. 2, this configuration is termed a "multi-tanh quin".

A differential output current $\Delta I$ of this conventional OTA is expressed as the following equation (17):

$$\Delta I = \alpha_F \left\{ \frac{2I_{01}\sinh\left(\frac{V_i}{V_T}\right)}{\cosh\left(\frac{V_i}{V_T}\right)+\cosh\left(\frac{V_{K1}}{V_T}\right)} + \frac{2I_{02}\sinh\left(\frac{V_i}{V_T}\right)}{\cosh\left(\frac{V_i}{V_T}\right)+\cosh\left(\frac{V_{K2}}{V_T}\right)} \right\} \quad (17)$$

Since the condition of the transconductance to be maximally flat is given by $$\left.\frac{d^3(\Delta I)}{dV_i^3}\right|_{V_i=0} = 0,$$

the following equation (18) is obtained.

$$2I_{01} \frac{\cosh\left(\frac{V_{K1}}{V_T}\right)-2}{\left\{\cosh\left(\frac{V_{K1}}{V_T}\right)+1\right\}^2} + 2I_{02} \frac{\cosh\left(\frac{V_{K2}}{V_T}\right)-2}{\left\{\cosh\left(\frac{V_{K2}}{V_T}\right)+1\right\}^2} = 0 \quad (18)$$

From the condition that the fifth-order differential coefficient of the differential output current $\Delta I$ is equal to zero at $V_i=0$, i.e., $$\left.\frac{d^5(\Delta I)}{dV_i^5}\right|_{V_i=0} = 0,$$

the following equation (19) is obtained.

$$2I_{01}\frac{\left\{\cosh\left(\frac{V_{K1}}{V_T}\right)\right\}^2 - 13\cosh\left(\frac{V_{K1}}{V_T}\right)+\frac{16}{\left\{\cosh\left(\frac{V_{K1}}{V_T}\right)+1\right\}^3}} + \quad (19)$$

$$2I_{02}\left\{\cosh\left(\frac{V_{K2}}{V_T}\right)\right\}^2 - 13\cosh\left(\frac{V_{K2}}{V_T}\right)+\frac{16}{\left\{\cosh\left(\frac{V_{K2}}{V_T}\right)+1\right\}^3} = 0$$

Therefore, $$\cosh(V_{K1}/V_T) = 4 - \sqrt{15/2} \ (\approx 1.2624)(\text{i.e., } K_1 \approx 2.030),$$

$$\cosh(V_{K2}/V_T) = 4 + \sqrt{15/2} \ (\approx 6.739)$$

(i.e., $K_2 = \exp(\cosh^{-1} V_{K2}) \approx 13.403$)

are established.

Thus, the constant current $I_{01}$ is given as $$I_{01} = \left[\left(\sqrt{15/2}+2\right)/\left(\sqrt{15/2}-2\right)\right] \cdot \left[\left(\sqrt{15/2}-5\right)/\left(\sqrt{15/2}+5\right)\right]^2 I_{02}$$

$$(\approx 0.5478 I_{02}).$$

Accordingly, $B_2=1$, $B_1=16$, $B_0=18$, $C_2\approx 3.0957 I_{01}$, and $C_1\approx 19.81252 I_{01}$ are obtained.

The differential output current $\Delta I$ is given by the following equation (20), where $I_0=I_{01}$.

$$\Delta I = \frac{\alpha_F I_0 \left\{3.0957\sinh\left(\frac{2V_i}{V_T}\right)+19.81242\sinh\left(\frac{V_i}{V_T}\right)\right\}}{\cosh\left(\frac{2V_i}{V_T}\right)+16\cosh\left(\frac{V_i}{V_T}\right)+18} \quad (20)$$

For the above multi-tanh quintuplet, various transfer functions can be obtained from the condition of $$\left.\frac{d^3(\Delta I)}{dV_i^3}\right|_{V_i=0} = 0.$$

For example, when $I_{O1}=I_{O2}=I_O$,
$\cosh(V_{K1}/V_T)=1.5$ (i.e., $K_1=\exp[\cosh^{-1} V_{K1}]\approx 2.6180$)
$\cosh(V_{K2}/V_T)=4$ (i.e., $K_2=\exp[\cosh^{-1} V_{K2}]\approx 7.873$),
the coefficients are given as
$B_2=1$, $B_1=16$, $B_0=18$, $C_2=4$, and $C_1=22$.
The differential output current $\Delta I$ in this case is expressed by the following equation (21).

$$\Delta I = \frac{2\alpha_F I_0\left\{2\sinh\left(\frac{2V_i}{V_T}\right)+11\sinh\left(\frac{V_i}{V_T}\right)\right\}}{\cosh\left(\frac{2V_i}{V_T}\right)+11\cosh\left(\frac{V_i}{V_T}\right)+13} \quad (21)$$

The input voltage range of the multi-tanh quintuplet providing a linear transconductance characteristic, which is given by the equation (21), is approximately as narrow as that of the multi-tanh triplet given by the above equation (16).

Generally, to cause the input voltage range to be as wide as possible in the multi-tanh cells having maximally flat characteristics, high, odd-order differential coefficients (a fifth-order differential coefficient or higher) needs to be zero at $V_i=0$.

It should be noted that the denominator of each differential output current $\Delta I$ expressed by the above equation (12), (16), (17) or (20) is expressed by a sum of hyperbolic cosine functions and that each of the coefficients of the hyperbolic cosine functions are expressed by a natural number.

With the above described conventional OTAs employing the multi-tanh technique, an obtainable input voltage range providing the linear transconductance characteristic is at most 200 $mV_{p-r}$.

FIG. 4 represents the transconductance characteristics of the multi-tanh doublet of FIG. 3 (curve c), the multi-tanh triplet of FIG. 5 (curve b) and the multi-tanh quad (curve a), in which $V_I$ is the thermal voltage whose value is approximately 25 to 26 mV at room temperature).

As described above, with the conventional OTAs using the multi-tanh technique, the denominator of the differential output current $\Delta I$ is expressed by a cosh function or functions and the numerator thereof by a sinh function or functions.

When the numerator of the differential output current $\Delta I$ includes a sinh function or functions only, the transconductance linearity is dependent upon the functional form of the denominator thereof.

An OTA is an essential, basic function block in analog signal applications. Recently, fabrication processes for large-scale integrated circuit devices (LSIs) have been becoming finer and finer and as a result, the supply voltage for the LSIs has been decreasing from 5 V to 3 V, 2V, or 1V. This tendency has been increasing the necessity for the low-voltage circuit technique more and more.

Also, although the above-described conventional OTAs using the multi-tanh technique are capable of low-voltage operation, they have a problem that the input voltage range providing the linear transconductance characteristic is very narrow. To cause the input voltage range to be wider, another problem that the circuit scale and current consumption increase will occur.

Further, with the above-described conventional OTAs using the multi-tanh technique, the dc offset voltage for each differential transistor pair is generated by the difference of the emitter areas or sizes of the corresponding two bipolar transistors, a realizable emitter-area ratio of the transistors is at most several tens. As a result, a problem that an obtainable input voltage range is at most approximately 100 $mV_{P-P}$ occurs.

SUMMARY OF THE INVENTION

Accordingly, an object of the present invention is to provide a bipolar OTA having a wider input voltage range than that of the conventional OTAs without increasing the circuit scale and current consumption.

Another object of the present invention is to provide a bipolar OTA capable of low voltage operation at a power supply voltage of approximately 1 V.

The above objects together with others not specifically mentioned will become clear to those skilled in the art from the following description.

A bipolar OTA according to a first aspect of the present invention includes a first differential pair of first and second bipolar transistors whose emitters are coupled together; a second differential pair of third and fourth bipolar transistors whose emitters are coupled together; a common current source or sink connected to the coupled emitters of the first and second bipolar transistors and the coupled emitters of the third and fourth bipolar transistors; a first input terminal connected to a base of the first bipolar transistor; a second input terminal connected to a base of the second bipolar transistor; a third input terminal connected to a base of the third bipolar transistor; and a fourth input terminal connected to a base of the fourth bipolar transistor.

The first, second, third and fourth bipolar transistors are driven by a common tail current produced by the common current source or sink.

A first input voltage as an input signal to be amplified is differentially applied across the first and second input terminals.

First and second dc offset voltages are applied to the third and fourth input terminals, respectively. A second input voltage, which is produced by dividing or attenuating the first input voltage, is differentially applied across the third and fourth input terminals.

An output current as an amplified output signal is differentially derived from collectors of the first and second bipolar transistors.

With the bipolar OTAs according to the first aspect of the present invention, the first input voltage is differentially applied across the bases of the first and second transistors, and the second input voltage is differentially applied across the bases of the third and fourth transistors. The second input voltage is generated by attenuating the first input voltage. Accordingly, a wider input voltage range than that of the conventional OTAs can be obtained.

Also, the bipolar OTA according to the present invention has the above configurations, respectively, they are capable of low voltage operation at a power supply voltage of approximately 1 V.

Since only one constant current source or sink is required and the emitter areas or sizes of the bipolar transistors can be equal, the circuit scale and consequently current consumption are not increased.

A fifth bipolar transistor driven by the common current source or sink maybe additionally used for applying a third input voltage.

In a preferred embodiment of the OTA according to the first aspect of the invention, the second input voltage is generated by using a resistive voltage divider. In this case, an additional advantage of a simple circuit configuration can be obtained.

A bipolar OTA according to a second aspect of the present invention includes a differential pair of first and second bipolar transistors whose emitters are coupled together; a third bipolar transistor whose emitter is connected to said emitters of said first and second transistors; a common current source or sink connected to the emitters of the first, second and third bipolar transistors; a first input terminal connected to a base of the first bipolar transistor; a second input terminal connected to a base of the second bipolar transistor; and a third input terminal connected to a base of the third bipolar transistor.

The first, second and third bipolar transistors are driven by a common tail current produced by the common current source or sink.

An input voltage as an input signal to be amplified is differentially applied across the first and second input terminals.

A dc voltage is applied to the third input terminal.

An output current as an amplified output signal is differentially derived from collectors of the first and second bipolar transistors.

With the bipolar OTAs according to the second aspect of the present invention, the input voltage is differentially applied across the bases of the first and second transistors, and the dc voltage is applied to the base of the third transistor. Accordingly, a wider input voltage range than that of the conventional OTAs can be obtained.

Also, the bipolar OTA according to the second aspect of the present invention has the above configuration, it is capable of low voltage operation at a power supply voltage of approximately 1 V.

Since only one constant current source or sink is required and the emitter areas or sizes of the first to third bipolar transistors can be equal, the circuit scale and consequently current consumption are not increased.

In a preferred embodiment of the OTA according to the second aspect of the invention, a second differential pair of fourth and fifth bipolar transistors whose emitters are coupled together is provided. The second differential pair is driven by the common tail current. A third input terminal is connected to a base of the third bipolar transistor and a fourth input terminal is connected to a base of the fourth bipolar transistor. A second input voltage, which is produced by attenuating the first input voltage, is differentially applied across the third and fourth input terminals.

In another preferred embodiment of the OTA according to the second aspect of the invention, the second input voltage is generated by using a resistive voltage divider. An additional advantage of a simple circuit configuration can be obtained.

BRIEF DESCRIPTION OF THE DRAWINGS

In order that the present invention may be read y carried into effect, it will now be described with reference to the accompanying drawings.

DETAILED DESCRIPTION OF THE PREFERRED EMBODIMENTS

Figure 1:
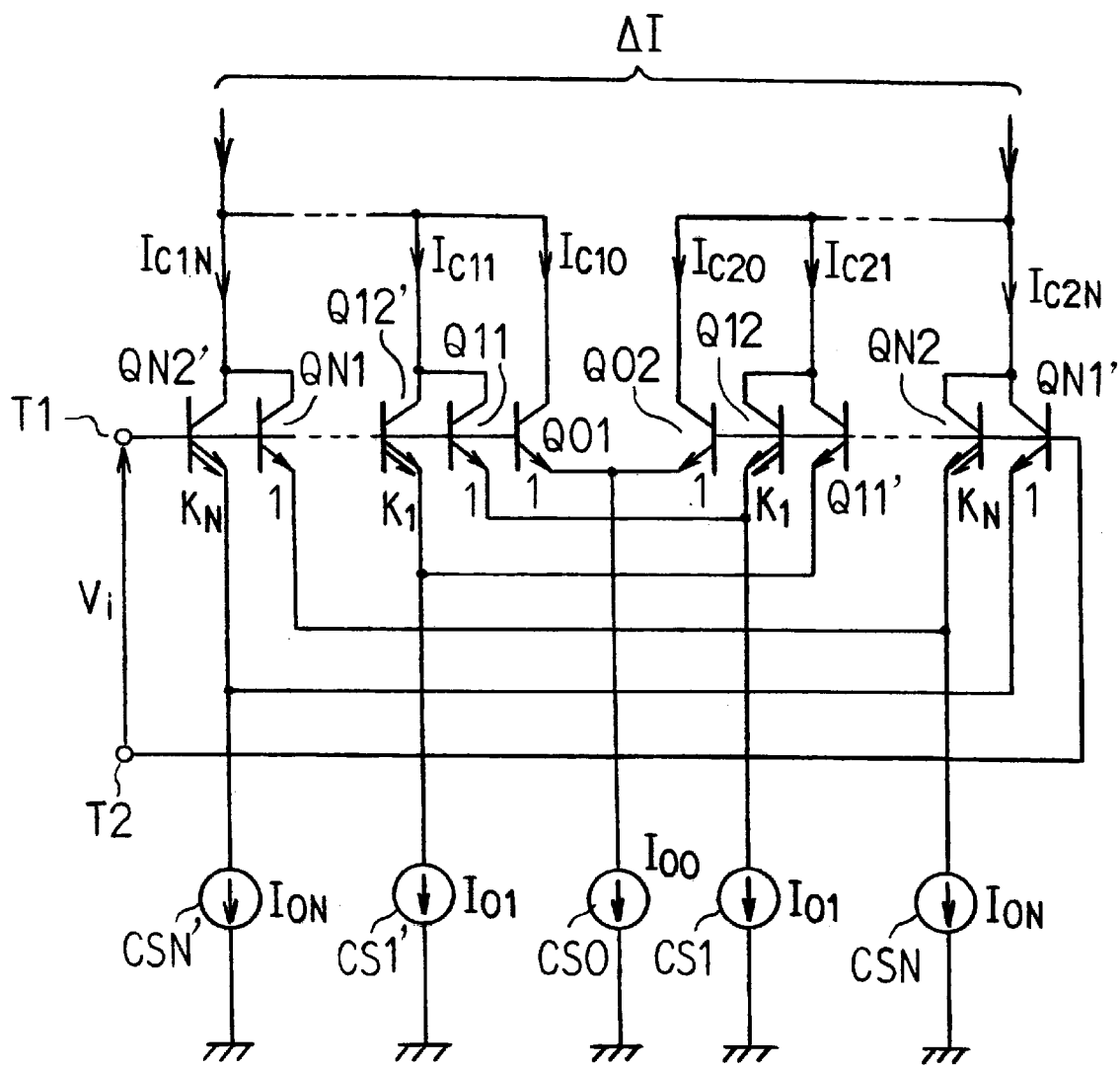
FIG. 1 is a circuit diagram of a conventional bipolar OTA, in which (2N+1) differential transistor pairs are used.
Figure 2:
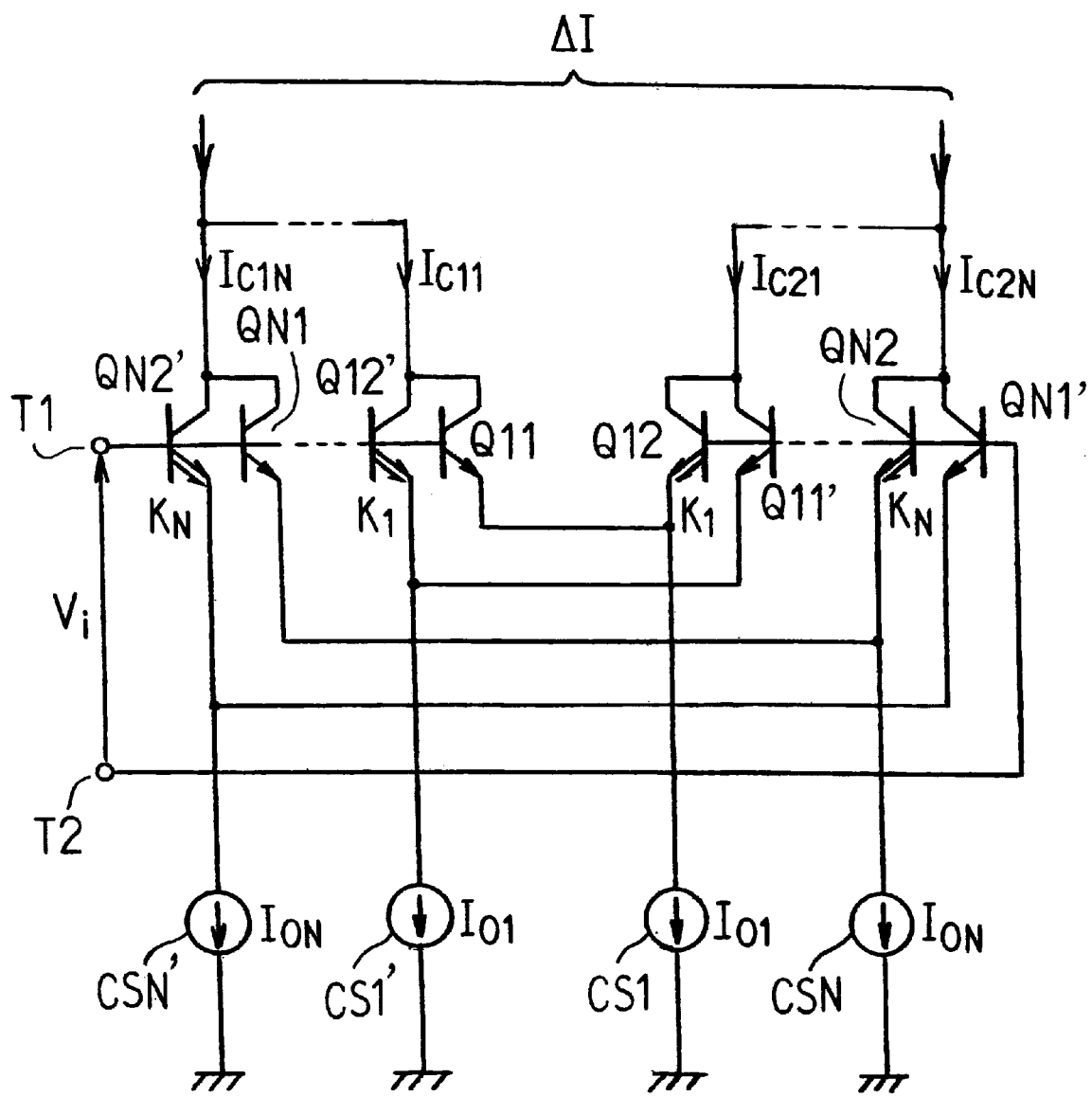
FIG. 2 is a circuit diagram of a conventional bipolar OTA, in which 2N differential transistor pairs are used.

Preferred embodiments of the present invention will be described in detail below while referring to the drawings attached.

In the following description, since an emitter of a bipolar transistor is often called as a tail, a circuit cell consisting of three or more emitter-coupled bipolar transistors driven by a common tail current is termed a "multitail cell". For example, a cell consisting of three transistors is termed a "triple-tail cell".

First Embodiment

Figure 6:
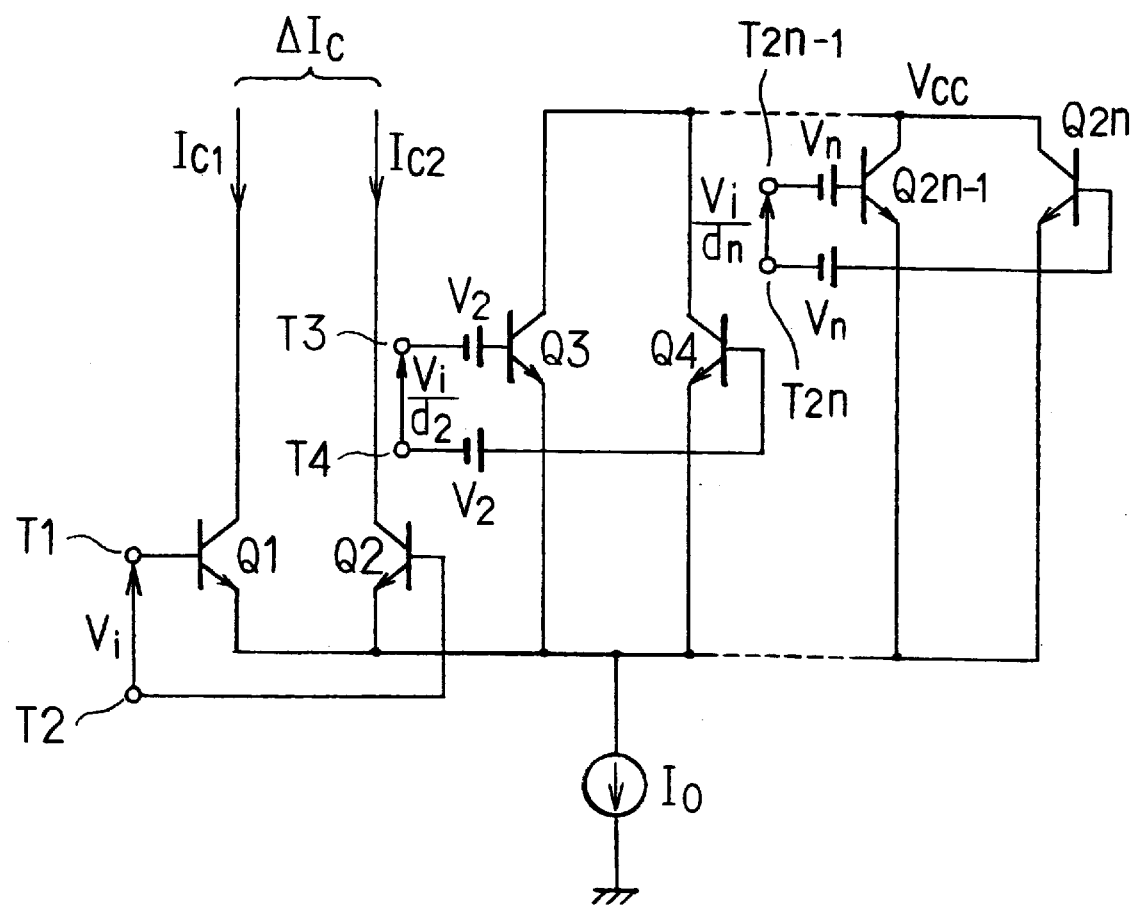
FIG. 6 is a circuit diagram of a bipolar OTA according to a first embodiment of the present invention.

A bipolar OTA according to a first embodiment of the present invention is shown in FIG. 6.

As shown in FIG. 6, this OTA includes first to n-th balanced differential pairs of npn bipolar transistors whose emitters are coupled together, and a common constant current sink (current: $I_0$) for driving the first to n-th differential pairs, where n is a positive integer equal to or greater than two.

The coupled emitters of the two transistors of each differential pair are connected in common to one end of the current sink. The other end of the current sink is grounded.

The emitter areas of all the transistors Q1 to Q2n are equal to that of a unit bipolar transistor.

The first differential pair is composed of npn bipolar transistors Q1 and Q2 whose bases are connected to a first pair of input terminals T1 and T2, respectively. A differential input voltage $V_1$ as an input signal to be amplified is applied across the bases of the transistors Q1 and Q2 through the input terminals T1 and T2.

A differential output current ΔI of the OTA as an amplified output signal is derived from collectors of the transistors Q1 and Q2 of the first differential pair. The differential output current ΔI is defined as $\Delta I = I_{C1} - I_{C2}$, where $I_{C1}$ and $I_{C2}$ are collector currents of the transistors Q1 and Q2, respectively.

The second differential pair is composed of npn bipolar transistors Q3 and Q4 whose bases are connected to a second pair of input terminals T3 and T4, respectively. An attenuated differential input voltage ($V_i/d_2$) of $V_i$ is applied across the bases of the transistors Q3 and Q4 through the input terminals T3 and T4, where $d_2$ is an attenuation parameter greater than unity. Two dc offset voltages $V_2$ are additionally applied to the bases of the transistors Q3 and Q4, respectively. Collectors of the transistors Q3 and Q4 are coupled together to be applied with a power supply voltage $V_{CC}$.

Similarly, the n-th differential pair is composed of npn bipolar transistors Q2n−1 and Q2n whose bases are connected to an n-th pair of input terminals T2n−1 and T2n, respectively. An attenuated differential input voltage ($V_i/d_n$) of $V_i$ is applied across the input terminals T2n−1 and T2n the input terminals T2n−1 and T2n, where $d_n$ is an attenuation parameter greater than unity two dc offset voltages $V_n$ are additionally applied to the bases of the transistors Q2n−1 and Q2n, respectively. Collectors of the transistors Q2n−1 and Q2n are coupled together to be applied with the power supply voltage $V_{CC}$.

The second to n-th differential pairs constitute a current bypass circuit for the first differential pair.

The differential output current ΔI of the bipolar OTA according to the first embodiment of FIG. 6 is expressed as the following equation (22a).

$$\Delta I_C = I_{C1} - I_{C2} \quad (22a)$$

$$= \frac{\alpha_F I_0 \sinh\left(\frac{V_i}{2V_T}\right)}{\cosh\left(\frac{V_i}{2V_T}\right) + \sum_{j=2}^{n}\left\{A_j \cosh\left(\frac{V_i}{2d_j V_T}\right)\right\}}$$

In the equation (22a), $A_j$ is a constant of the j-th differential pair defined as $$A_j = K_j \exp\left(\frac{V_{Cj}}{V_T}\right) \quad (23)$$

where $K_j$ is a constant of the j-th differential pair, $V_{cj}$ is a dc tuning voltage thereof.

The transconductance of the OTA according to the first embodiment is obtained as the following equation (24a) by differentiating the equation (22a) with the differential input voltage $V_i$.

$$\frac{d(\Delta I_C)}{dV_i} = \frac{\alpha_F I_0}{2V_T}\left[\frac{\cosh\left(\frac{V_i}{2V_T}\right)}{\cosh\left(\frac{V_i}{2V_T}\right) + \sum_{j=2}^{n}\left\{A_j\cosh\left(\frac{V_i}{2d_j V_T}\right)\right\}} - \frac{\sinh\left(\frac{V_i}{2V_T}\right)\left[\sinh\left(\frac{V_i}{2V_T}\right) + \sum_{j=1}^{n}\left\{\frac{A_j}{d_j}\sinh\left(\frac{V_i}{2d_j V_T}\right)\right\}\right]}{\left(\left[\cosh\left(\frac{V_i}{2V_T}\right) + \sum_{j=2}^{n}\left\{A_j\cosh\left(\frac{V_i}{2d_j V_T}\right)\right\}\right]\right)^2}\right] \quad (24a)$$

The condition of the transconductance to be maximally flat is given by $$\left.\frac{d^3(\Delta I)}{dV_i^3}\right|_{V_i=0} = 0.$$

Therefore, the following relationship (25a) is obtained by differentiating the equation (22a) with $V_i$ three times.

$$\left\{1 + \sum_{j=2}^{n}(A_j)\right\} - 3\left\{1 + \sum_{j=2}^{n}\left(\frac{A_j}{d_j}\right)\right\} = 0 \quad (25a)$$

With the bipolar OTA according to the first embodiment shown in FIG. 6, the transistors Q3 to Q2n forming the second to n-th differential pairs, which are not connected to the differential output ends of the OTA, constitute a current bypass subcircuit, because they allow a part of the common tail current $I_0$ to bypass the first differential pair of the transistors Q1 and Q2.

It can be said that the sum of the collector currents $I_{C1}$ and $I_{C2}$ of the transistors Q1 and Q2 of the first differential pair has an approximately square-law characteristic.

As already stated above, the numerator of the differential output current ΔI in the equation (22a) includes a sinh function only and therefore, the transconductance linearity is dependent upon the functional form of the denominator thereof. Thus, if the constants $A_j$ defined by the equation (23) are set to be natural numbers, the OTA according to the first embodiment can have a wider input voltage range providing the linear transconductance characteristic than that of the conventional bipolar OTAs.

The OTA according to the first embodiment can be formed by a single constant current sink and the bipolar transistors having the same emitter area or size and accordingly, the circuit scale and consequently current consumption can be restrained from increasing.

Also, because the bipolar OTA according to the first embodiment has the above configuration, it is capable of low voltage operation at a power supply voltage as low as approximately 1 V.

Second Embodiment

Figure 7:
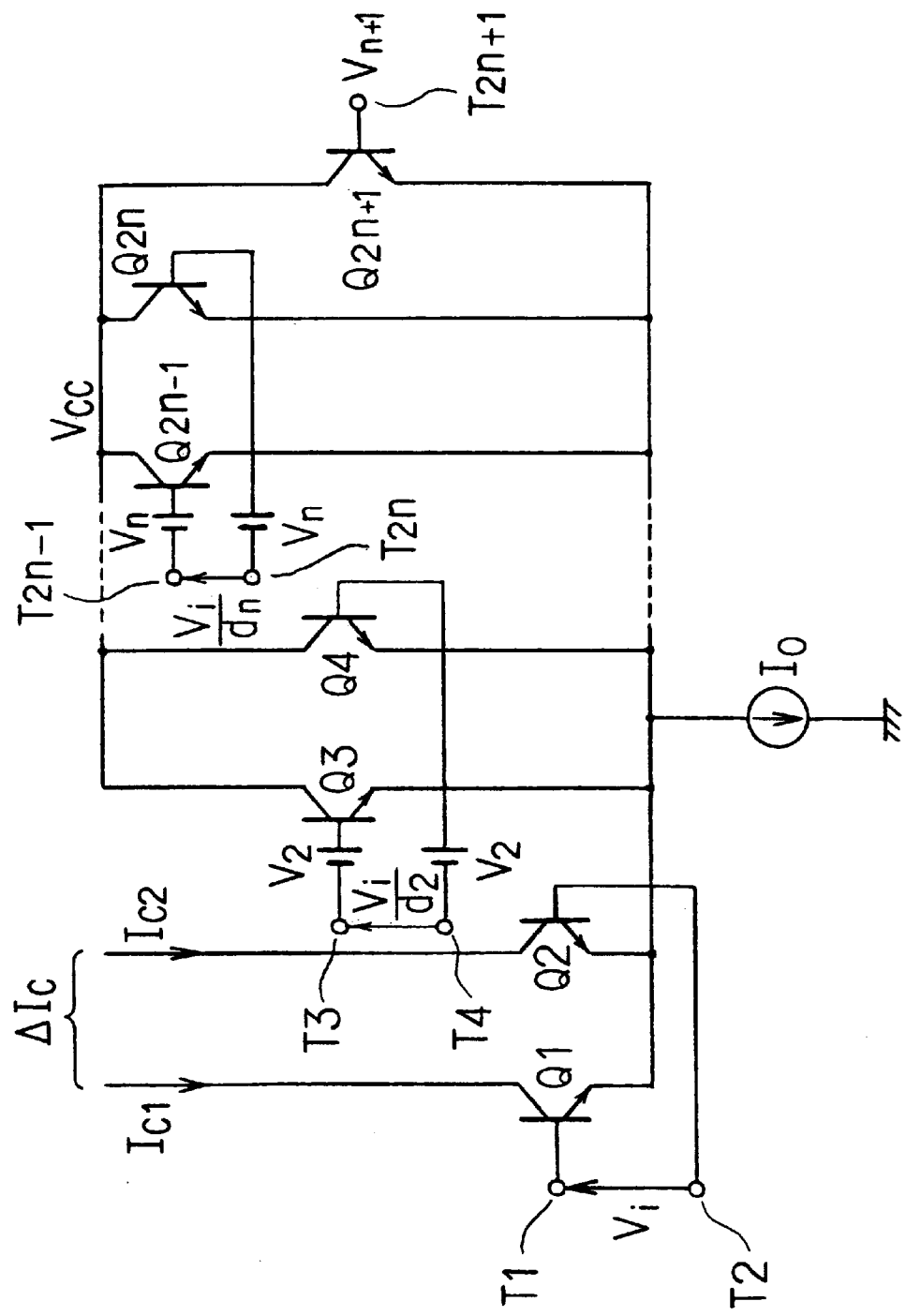
FIG. 7 is a circuit diagram of a bipolar OTA according to a second embodiment of the present invention.

A bipolar OTA according to a second embodiment of the present invention is shown in FIG. 7.

As shown in FIG. 7, this OTA has the same configuration as that of the OTA according to the first embodiment except that an npn bipolar transistor Q2n+1 is additionally used to be applied with a dc tuning voltage $V_{n+1}$ and that n is equal to or greater than unity. The emitter area of the transistor Q2n+1 also is equal to that of a unit bipolar transistor. Therefore, the description about the same configuration is omitted here by adding the same reference characters to the corresponding elements for the sake of simplification.

An emitter of the transistor Q2n+1 is connected to the coupled emitters of the transistors Q1 to Q2n of the first to n-th differential pairs and is connected to the common current sink. A collector of the transistor Q2n+1 is connected to the coupled collectors of the transistors Q3 to Q2n of the third to n-th differential pairs, and is applied with the power supply voltage $V_{CC}$. A base of the transistor Q2n+1 is connected to an input terminal T2n+1. A dc voltage $V_{n+1}$ is applied to the base of the transistor Q2n+1 through the input terminal T2n+1.

The differential output current ΔI of the bipolar OTA according to the second embodiment of FIG. 7 it expressed as the following equation (22b).

$$\Delta I_C = I_{C1} - I_{C2} \qquad (22b)$$
$$= \frac{\alpha_F I_0 \sinh\left(\frac{V_i}{2V_T}\right)}{\cosh\left(\frac{V_i}{2V_T}\right) + \sum_{j=2}^{n}\left\{A_j \cosh\left(\frac{V_i}{2d_j V_T}\right)\right\} + A_{n+1}}$$

The transconductance of the OTA according to the second embodiment is obtained as the following equation (24b) by differentiating the equation (22b) with the differential input voltage $V_i$.

$$\frac{d(\Delta I_C)}{dV_i} = \frac{\alpha_F I_0}{2V_T}\left[\frac{\cosh\left(\frac{V_i}{2V_T}\right)}{\cosh\left(\frac{V_i}{2V_T}\right) + \sum_{j=2}^{n}\left\{A_j \cosh\left(\frac{V_i}{2d_j V_T}\right)\right\} + A_{n+1}} - \frac{\sinh\left(\frac{V_i}{2V_T}\right)\left[\sinh\left(\frac{V_i}{2V_T}\right) + \sum_{j=2}^{n-1}\left\{\frac{A_j}{d_j}\sinh\left(\frac{V_i}{2d_j V_T}\right)\right\}\right]}{\left[\left[\cosh\left(\frac{V_i}{2V_T}\right) + \sum_{j=1}^{n}\left\{A_j \cosh\left(\frac{V_i}{2d_j V_T}\right)\right\} + A_{n+1}\right]\right]^2}\right] \qquad (24b)$$

As the condition of the transconductance to be maximally flat, the following relationship (25b) is obtained by differentiating the both sides of the equation (22b) with V three times.

$$\left\{1 + \sum_{j=2}^{n+1} A_j\right\} - 3\left\{1 + \sum_{j=2}^{n}\left(\frac{A_j}{d_j}\right)\right\} = 0 \qquad (25b)$$

With the bipolar OTA according to the second embodiment of FIG. 7, similar to the OTA according to the first embodiment of FIG. 6, the transistors Q3 to Q2n forming the second to n-th differential pairs, which are not connected to the differential output ends of the OTA, constitute a current bypass subcircuit. The sum of the collector currents $I_{C1}$ and $I_{C2}$ of the transistors Q1 and Q2 of the first differential pair has an approximately square-law characteristic.

The numerator of the differential output current ΔI in the equation (22b) includes a sinh function only and therefore, the transconductance linearity is dependent upon the functional form of the denominator thereof. Thus, if the constants $A_j$ defined by the above equation (23) are set to be natural numbers, the OTA according to the second embodiment can have a wider input voltage range providing the linear transconductance characteristic than that of the conventional bipolar OTAs.

Since the OTA according to the second embodiment requires a single constant current sink and the bipolar transistors having the same emitter areas or sizes, the circuit scale and consequently the current consumption can be restrained from increasing.

Also, because the bipolar OTA according to the second embodiment has the above configuration, it is capable of low voltage operation at a power supply voltage as low as approximately 1 V.

Third Embodiment

Figure 8:
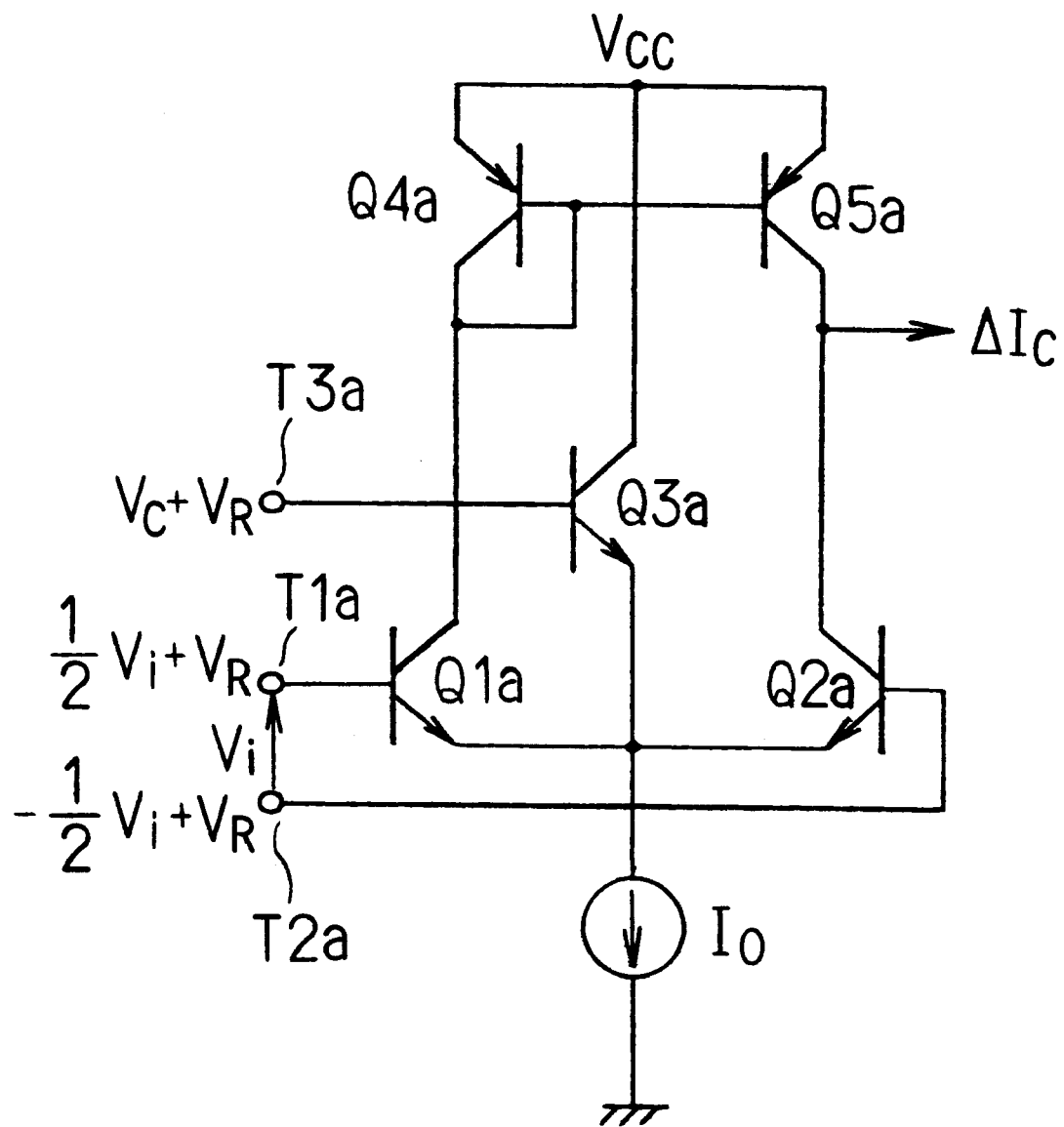
FIG. 8 is a circuit diagram of a bipolar OTA according to a third embodiment of the present invention.

A bipolar OTA according to a third embodiment of the present invention is shown in FIG. 8, which corresponds to an OTA obtained by setting n=1 (i.e., 2n+1=3) in the OTA according to the second embodiment of FIG. 7. This configuration is termed a "triple-tail cell".

As shown in FIG. 8, this OTA includes a balanced differential pair of npn bipolar transistors Q1a and Q2a whose emitters are coupled together, an npn bipolar transistor Q3a whose emitter is connected to the coupled emitters of the transistors Q1a and Q2a, and a common constant current sink (current: $I_0$) for driving the transistors Q1a, Q2a and Q3a. The emitters of the three transistors Q1a, Q2a and Q3a are connected in common to one end of the current sink. The other end of the current sink is grounded.

The emitter areas or sizes of the transistors Q1a and Q2a are equal to that of a unit bipolar transistor. In other words, the differential pair is a balanced one. The emitter area of the transistor Q3a also is equal to that of a unit bipolar transistor.

The bases of the transistors Q1a and Q2a are connected to a pair of input terminals T1a and T2a, respectively. The input terminal T1a is applied with a voltage of $[(\frac{1}{2})V_i + V_R]$, and the input terminal T1b is applied with a voltage of $[(-\frac{1}{2})V_i + V_R]$, where $V_R$ is a dc reference voltage. Therefore, a differential input voltage $V_i$ as an input signal to be amplified is applied across the pair of input terminals T1a and T2a, which is the same as that of the first and second embodiments of FIGS. 6 and 7.

A base of the transistor Q3a is connected to an input terminal T3a. The base of the transistor Q3a is applied with a dc voltage of $(V_C + V_R)$ through the input terminal T3a, where $V_C$ is a dc tuning voltage. A collector of the transistor Q3a is applied with the power supply voltage $V_{CC}$.

A current mirror circuit composed of pnp base-coupled bipolar transistors Q4a and Q5a is provided between a power supply (supply voltage: $V_{CC}$, not shown) and collectors of the transistors Q1a and Q2a. The current mirror circuit serves as an active load of the differential pair.

A collector and a base of the transistor Q4a are coupled together to be connected to the collector of the transistor Q1a, and an emitter thereof is applied with the supply voltage $V_{CC}$. A collector of the transistor Q5a is connected to the collector of the transistor Q2a and an emitter thereof is applied with the supply voltage $V_{CC}$.

A differential output current ΔI of the OTA as an amplified output signal is derived from the connection point of the collector of the transistor Q5a serving as an output end of the current mirror circuit and the collector of the transistor Q2a. The differential output current ΔI is defined as $\Delta I = I_{C1} - I_{C2}$, where $I_{C1}$ and $I_{C2}$, are collector currents of the transistors Q1a and Q2a, respectively.

From the above equation (23), the constant $A_2$ for the third embodiment is given by the following expression (26).

$$A_2 = \frac{K_2}{2}\exp\left(\frac{V_{C2}}{V_T}\right) = 2 \qquad (26)$$

If the value of $K_2$ is set as 1 (i.e., $K_2=1$), $V_{C2}=V_C=V_T\cdot\ln 4$ ($\approx 1.3863\ V_T$)$\approx 34.7$ mV.

Then, the differential output current ΔI of the OTA according to the third embodiment of FIG. 8 is given by setting n=1 in the equation (22b) as $$\Delta I_c = \frac{\alpha_F I_0 \sinh\left(\frac{V_i}{2V_T}\right)}{\cosh\left(\frac{V_i}{2V_T}\right) + 2} \qquad (27)$$

Figure 9:
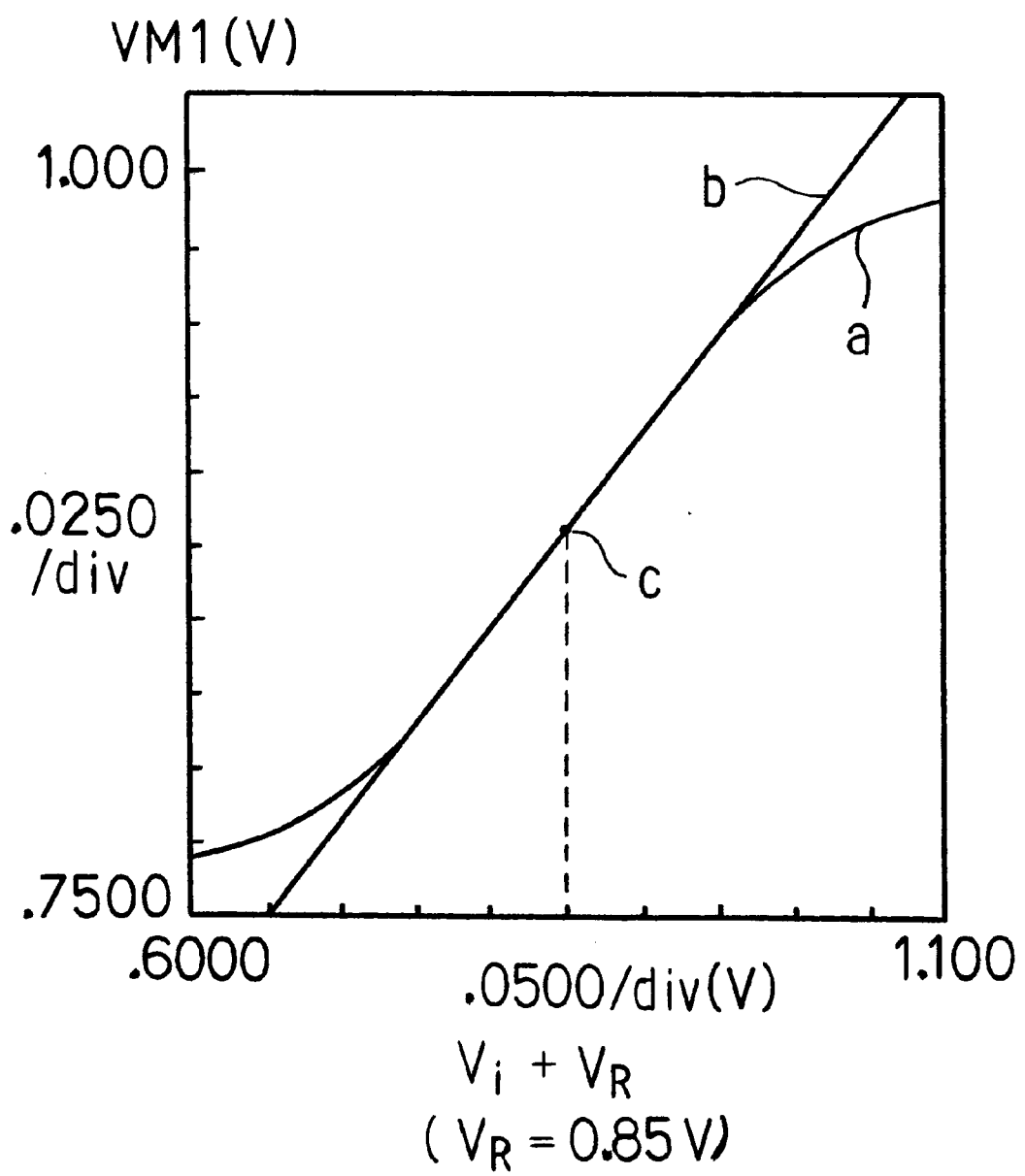
FIG. 9 is a graph showing a measured transfer characteristic of the bipolar OTA according to the first embodiment of the present invention.

A measured transfer characteristic for the triple-tail cell of FIG. 8 is shown in FIG. 9, in which the reference voltage $R_R$ was set as $V_R=0.85$ V and the supply voltage $V_{CC}$ was set as $V_{CC}=1$ V. The abscissa axis of FIG. 9 indicates the differential input voltage $V_i$, and the ordinate axis thereof indicates the differential output current ΔI measured in the voltage mode.

In FIG. 9, the curve a shows the measured transfer characteristic and the straight line b shows a tangential line of the curve a at a point c where $V_i=0$ V.

By differentiating the both sides of the equation (27) by $V_1$, the transconductance of the triple-tail cell of FIG. 8 is given by the following equation (28).

$$\frac{d(\Delta I_c)}{dV_i} = \frac{\alpha_F I_0}{2V_T} \cdot \frac{2\cosh\left(\frac{V_i}{2V_T}\right) + 1}{\left\{\cosh\left(\frac{V_i}{2V_T}\right) + 2\right\}^2} \qquad (28)$$

Figure 10:
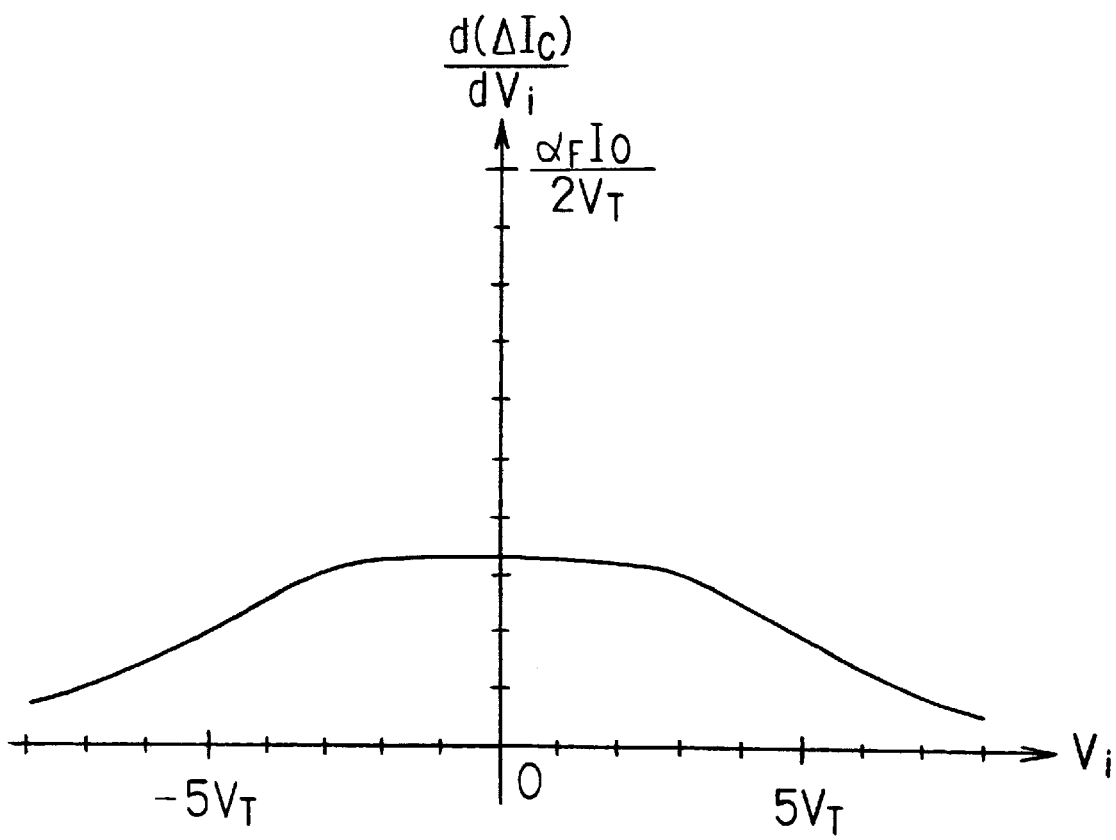
FIG. 10 is a graph showing the transconductance characteristic of the bipolar OTA according to the first embodiment of the present invention.

A measured transconductance characteristic for the triple-tail cell is shown in FIG. 10. The abscissa axis of FIG. 10 indicates the normalized differential input voltage $V_i$ by $V_r$.

It is seen from FIG. 10 that a realizable input voltage range providing the transconductance whose linearity is kept within a ±1% error is approximately 80 mV at peak-to-peak ($mV_{P-P}$).

Figure 3:
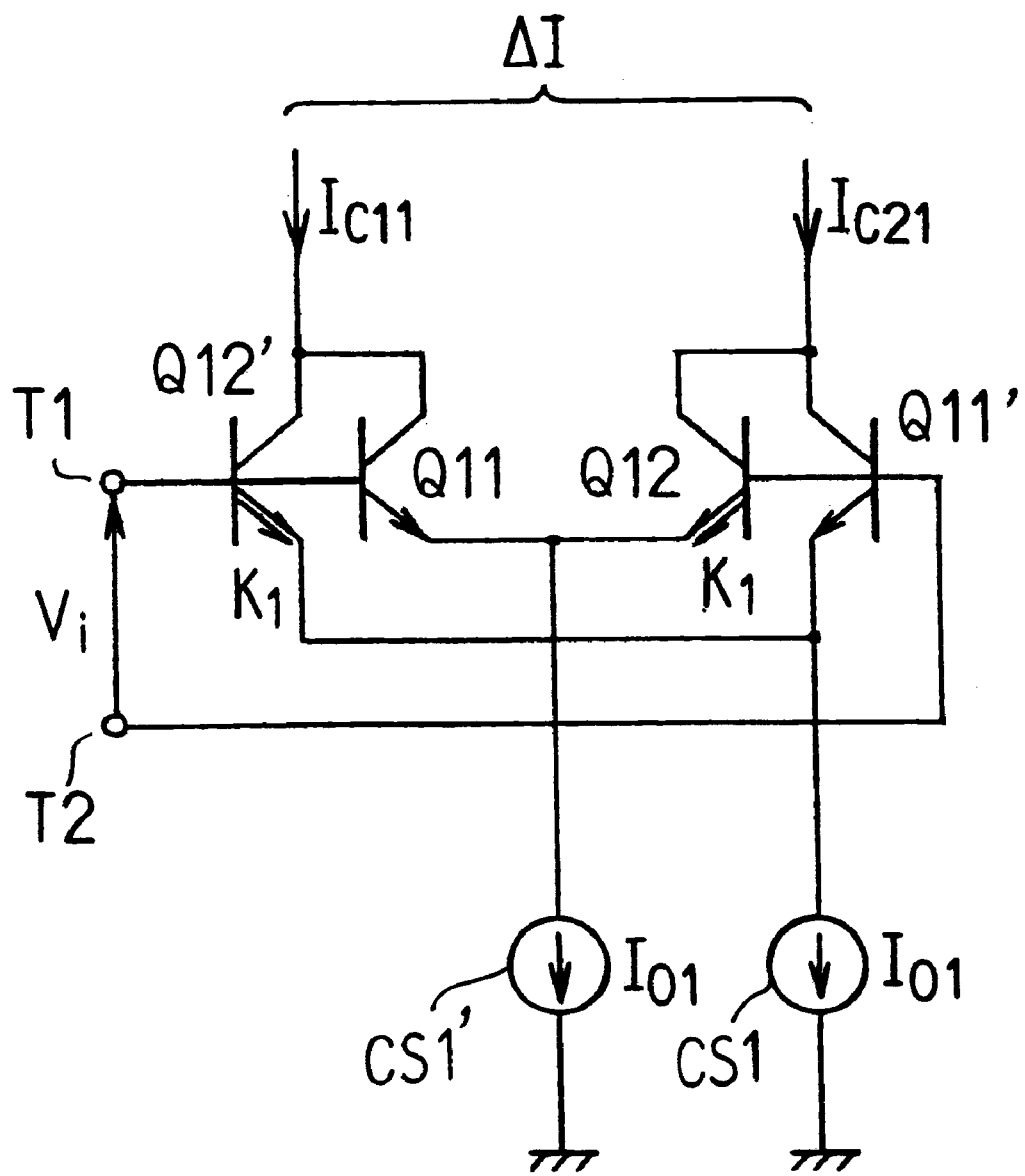
FIG. 3 is a circuit diagram of a conventional bipolar OTA, in which two differential transistor pairs are used.
Figure 4:
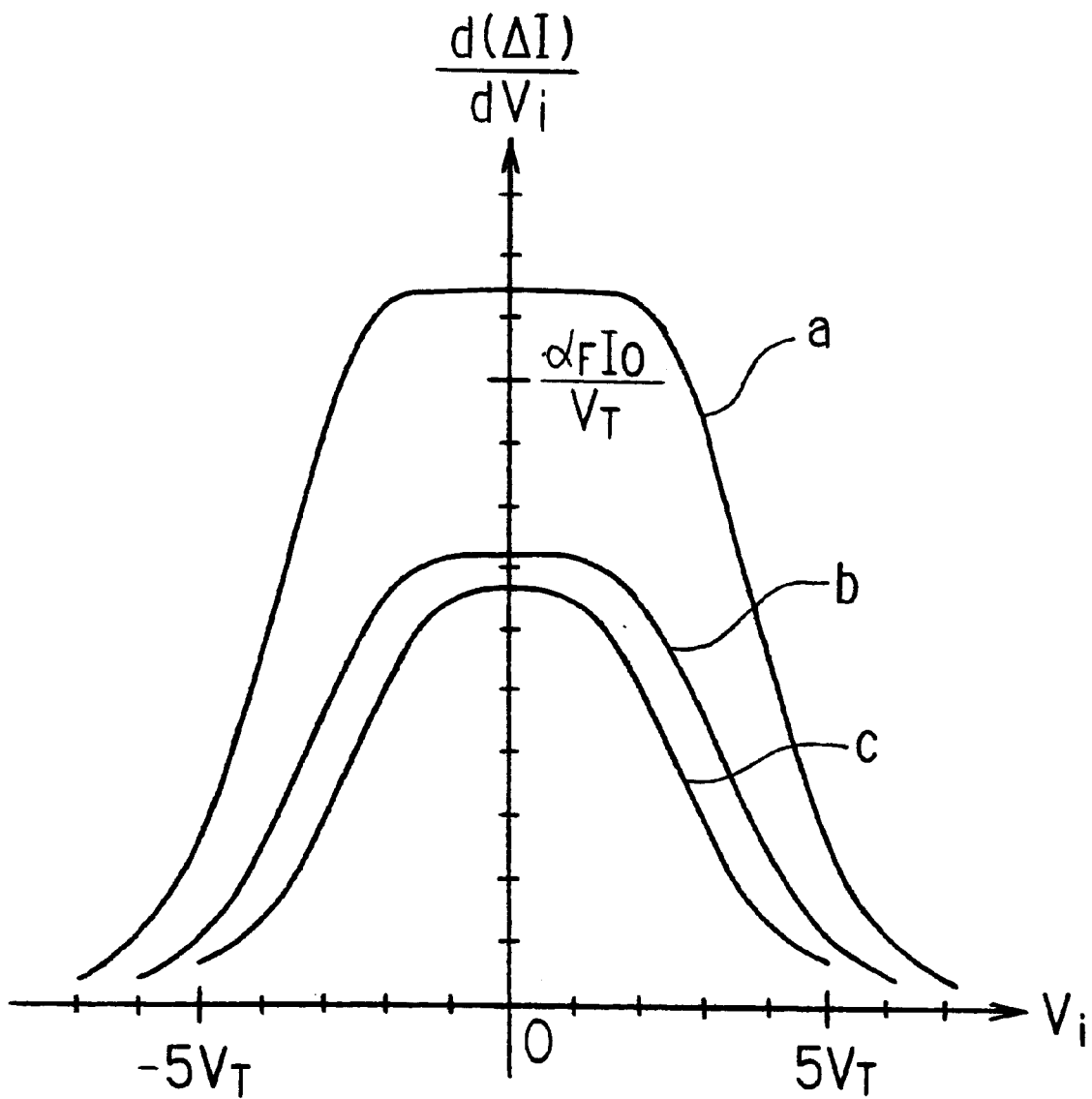
FIG. 4 is a graph showing the transconductance characteristics of the conventional OTAs.
Figure 5:
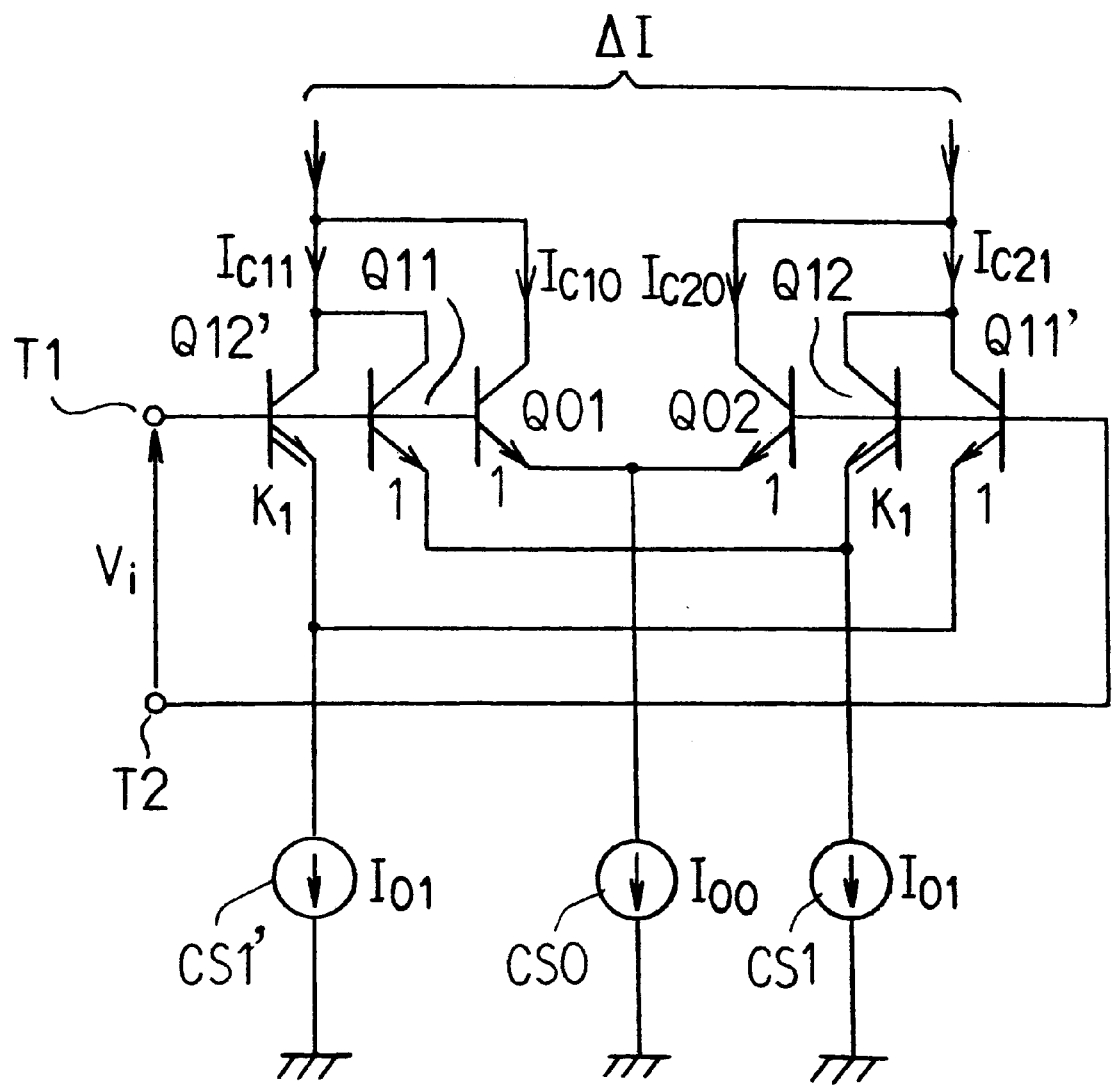
FIG. 5 is a circuit diagram of a conventional bipolar OTA, in which three differential transistor pairs are used.

Comparing the equations (27) and (12), the differential output current ΔI of the OTA according to the third embodiment has the same functional form as that of the conventional OTA shown in FIG. 3. This means that the same transconductance linearity as that of the conventional OTA of FIG. 3 can be obtained in the OTA according to the third embodiment also.

Specifically, the differential output current ΔI of the triple-tail cell according to the third embodiment is equal to a half of that of the conventional OTA of FIG. 3, because the coefficient of the numerator of the equation (27) is equal to a half of that of the equation (12). However, the input voltage range of the triple-tail cell providing the linear transconductance characteristic is equal to twice as wide as that of the conventional multi-tanh doublet of FIG. 3, because the variable ($V_1/2V_T$) for the sinh and cosh functions in the equation (27) is equal to a half of the variable ($V_1/V_T$) in the equation (12).

Fourth Embodiment

Figure 11:
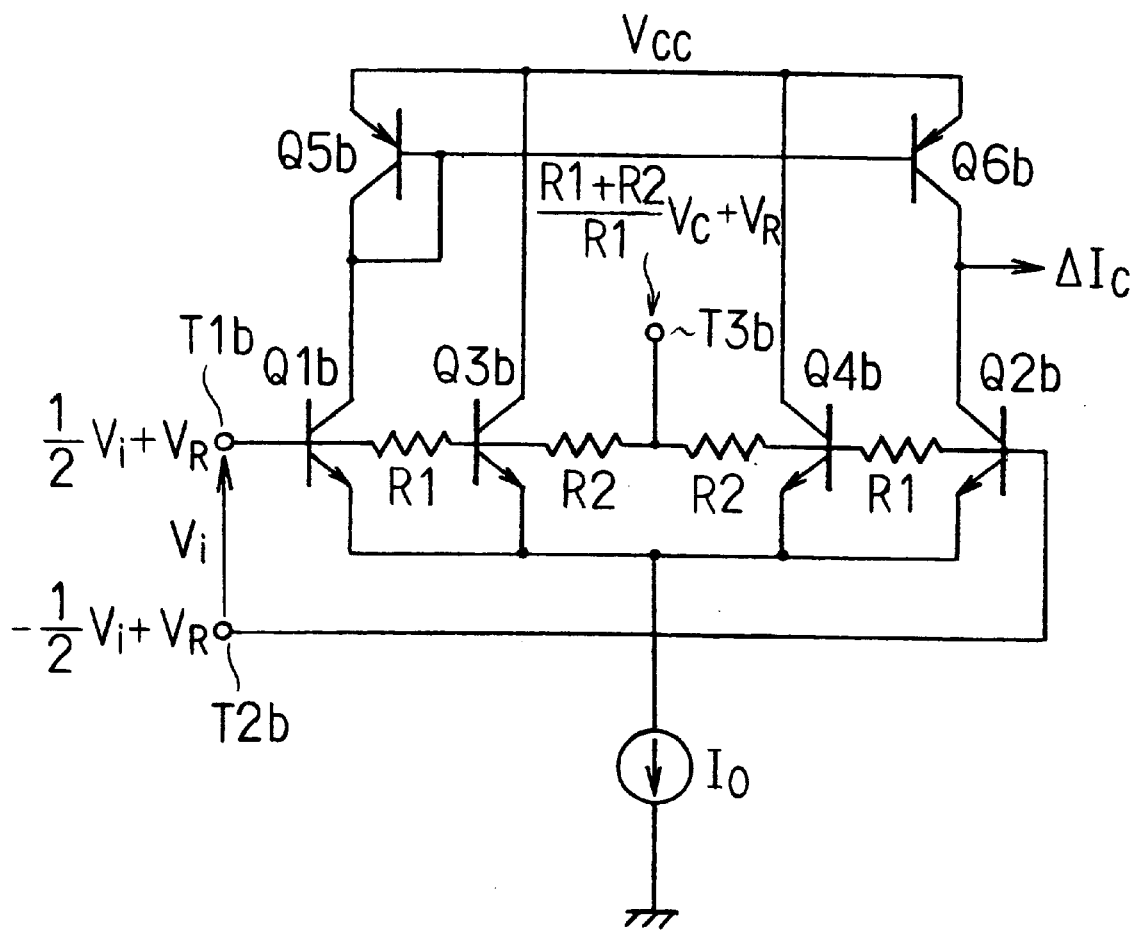
FIG. 11 is a circuit diagram of a bipolar OTA according to a fourth embodiment of the present invention.

A bipolar OTA according to a fourth embodiment of the present invention is shown in FIG. 11, which corresponds to an OTA obtained by setting n=2 (i.e., 2n=4) in the OTA according to the first embodiment of FIG. 6. This configuration is termed a "quadritail cell".

As shown in FIG. 11, this OTA includes a first balanced differential pair of npn bipolar transistors Q1b and Q2b whose emitters are coupled together, a second balanced differential pair of npn bipolar transistors Q3b and Q4b whose emitters are coupled together to be connected to the coupled emitters of the transistors Q1b and Q2b, and a common constant current sink (current: $I_0$) for driving the transistors Q1b, Q2b, Q3b and Q4b. The emitters of the four transistors Q1b, Q2b, Q3b and Q4b are connected in common to one end of the current sink. The other end of the current sink is grounded.

The emitter areas of the transistors Q1b and Q2b are equal to that of a unit bipolar transistor. The emitter areas of the transistors Q3b and Q4b also are equal to that of a unit bipolar transistor.

The bases of the transistors Q1b and Q2b are connected to a pair of input terminals T1b and T2b, respectively. The base of the transistor Q1b is applied with a voltage of $[(\frac{1}{2})V_i+V_R]$ through the input terminal T1b, and the base of the transistor Q2b is applied with a voltage of $[(-\frac{1}{2})V_i+V_R]$ through the input terminal T2b, where $V_R$ is a dc reference voltage. Therefore, a differential input voltage $V_i$ as an input signal to be amplified is applied across the input terminals T1b and T2b, which is the same as that of the third embodiment of FIG. 8.

The base of the transistor Q3b is connected to the base of the transistor Q1b and the input terminal T1b through a first resistor (resistance: R1). The base of the transistor Q4b is connected to the base of the transistor Q2b and the input terminal T2b through a second resistor (resistance: R1). Therefore, a differential input voltage ($V_i/d_2$), which is generated by attenuating the voltage $V_i$ by the first and second resistors, is applied across the bases of the transistors Q3b and Q4b, where $d_2$ is an attenuation parameter.

The base of the transistor Q3b is further connected to an input terminal T3b through a third resistor (resistance: R2). The base of the transistor Q4b is further connected to the input terminal T3b through a fourth resistor (resistance: R2).

The input terminal T3a is applied with a dc voltage of $[\{(R1+R2)/R1\}V_C+V_R]$, where $V_C$ is a dc tuning voltage. Collectors of the transistors Q3b and Q4b are applied with a power supply voltage $V_{CC}$.

The same dc voltage $V_2$ shown in FIG. 6, which is generated by the first to fourth resistors, is additionally applied to the bases of the transistors Q3b and Q4b, respectively A current mirror circuit composed of pnp base-coupled bipolar transistors Q5b and Q6b is provided between a power supply (supply voltage: $V_{CC}$, not shown) and collectors of the transistors Q1b and Q2b. The current mirror circuit serves as an active load of the first differential pair.

A collector and a base of the transistor Q5b are coupled together to be connected to a collector of the transistor Q1b, and an emitter thereof is applied with the supply voltage $V_{CC}$. A collector of the transistor Q6b is connected to a collector of the transistor Q2b and an emitter thereof is applied with the supply voltage $V_{CC}$.

A differential output current ΔI of the OTA as an amplified output signal is derived from the connection point of the collectors of the transistors Q6b and Q2b. The differential output current ΔI is defined as $\Delta I=I_{C1}-I_{C2}$, where $I_{C1}$ and $I_{C2}$ are collector currents of the transistors Q1b and Q2b, respectively.

From the above equation (23), the constant $A_2$ for the quadritail cell according to the fourth embodiment is given as $A_2=5$.

The resistance values R1 and R2 are set so that the relationship of $d_2=\sqrt{5}$ ($\approx 2.236$) is established. In other words, the resistance values R1 and R2 have a relationship of $$R2 = R1/(\sqrt{5}-1)(\approx 0.809\ R1).$$

Also, $V_{C2}=V_C=V_T\cdot\ln 5 (\approx 1.6094\ V_T\approx 40.2\ \text{mV})$, and $V_R=0.85$ V are established.

Then, the differential output current $\Delta I$ of the OTA according to the fourth embodiment of FIG. 11 is given by setting $n=2$ in the equation (22a) as $$\Delta I_C = \frac{\alpha_F I_0 \sinh\left(\frac{V_i}{2V_T}\right)}{\cosh\left(\frac{V_i}{2V_T}\right) + 5\cosh\left(\frac{V_i}{2\sqrt{5}\ V_T}\right)} \quad (29)$$

It is seen from the equation (29) that the denominator is expressed by a sinh function and the numerator is expressed by a sum of two cosh functions, and that each of their coefficients is a natural number. This means that the same transconductance linearity as that of the conventional OTAs can be realized.

Figure 12:
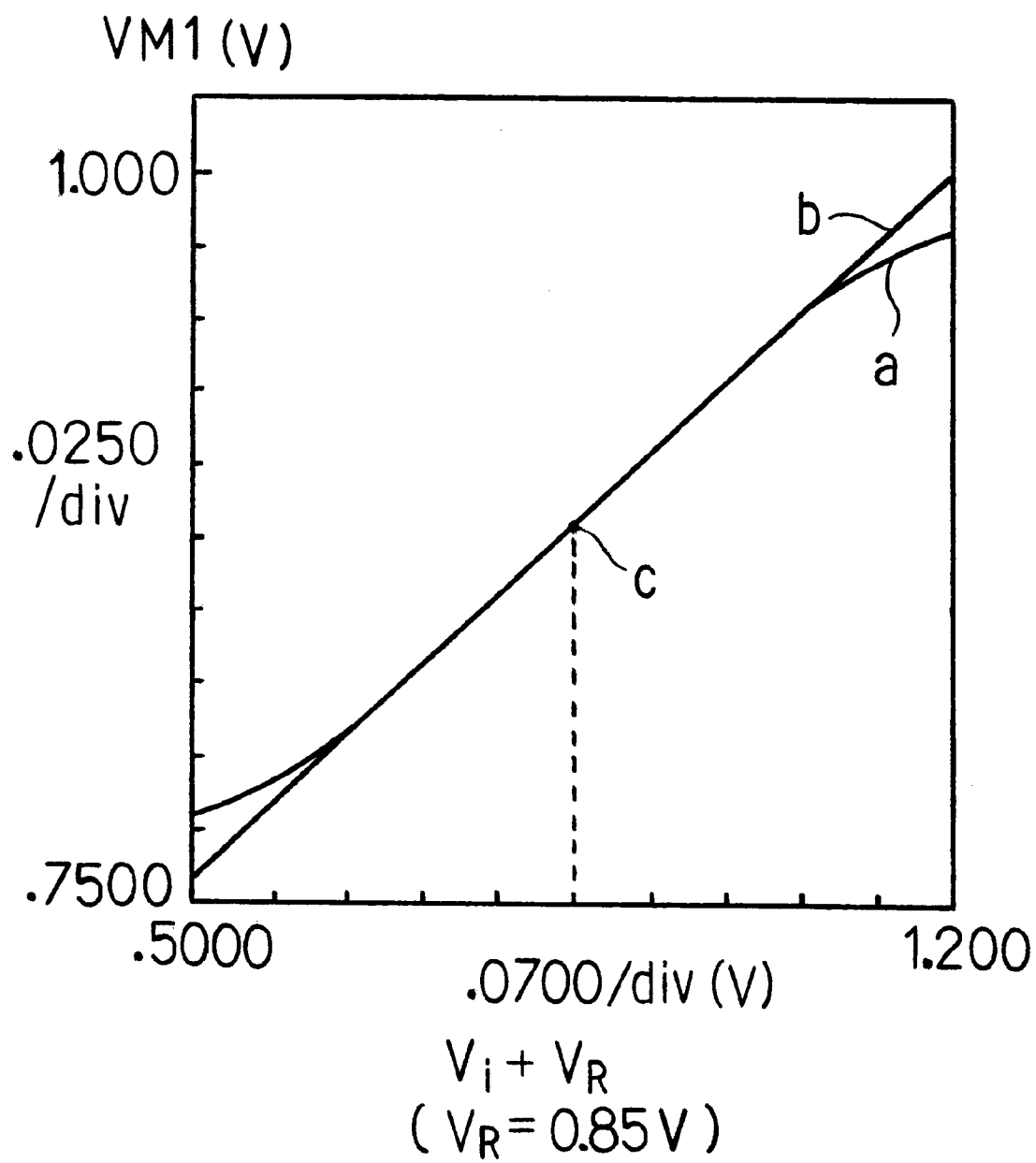
FIG. 12 is a graph showing a measured transfer characteristic of the bipolar OTA according to the fourth embodiment of the present invention.

A measured transfer characteristic for the quadritail cell of FIG. 11 is shown in FIG. 12, in which the reference and supply voltages $V_R$ and $V_{CC}$ were set as $V_R=0.85$ V and $V_{CC}=1$ V. The abscissa axis of FIG. 12 indicates the differential input voltage $V_i$, and the ordinate axis thereof indicates the differential output current $\Delta I$ measured in the voltage mode.

In FIG. 12, the curve a shows the measured transfer characteristic and the straight line b shows a tangential line of the curve a at a point C where $V_i=0$ V.

By differentiating the both sides of the equation (29) by $V_i$, the transconductance of the quadritail cell is given by the following equation (30) or (31).

$$\frac{d(\Delta I_c)}{dV_i} = \frac{\alpha_F I_0}{2V_T} \cdot \frac{5\cosh\left(\frac{V_i}{2V_T}\right)\cosh\left(\frac{V_i}{2\sqrt{5}\ V_T}\right) + \sqrt{5}\sinh\left(\frac{V_i}{2V_T}\right)\sinh\left(\frac{V_i}{2\sqrt{5}\ V_T}\right) + 1}{\left\{\cosh\left(\frac{V_i}{2V_T}\right) + 5\cosh\left(\frac{V_i}{2\sqrt{5}\ V_T}\right)\right\}^2} \quad (30)$$

$$\frac{d(\Delta I_c)}{dV_i} = \frac{\alpha_F I_0}{2V_T} \cdot \frac{1+5\left(\frac{\sqrt{5}-1}{2\sqrt{5}}\right)\cosh\left\{\left(\frac{\sqrt{5}+1}{2\sqrt{5}\ V_T}\right)V_T\right\} + 5\left(\frac{\sqrt{5}+1}{2\sqrt{5}}\right)\cosh\left\{\left(\frac{\sqrt{5}-1}{2\sqrt{5}\ V_T}\right) - V_T\right\}}{\left\{\cosh\left(\frac{V_i}{2V_T}\right) + 5\cosh\left(\frac{V_i}{2\sqrt{5}\ V_T}\right)\right\}^2} \quad (31)$$

Figure 13:
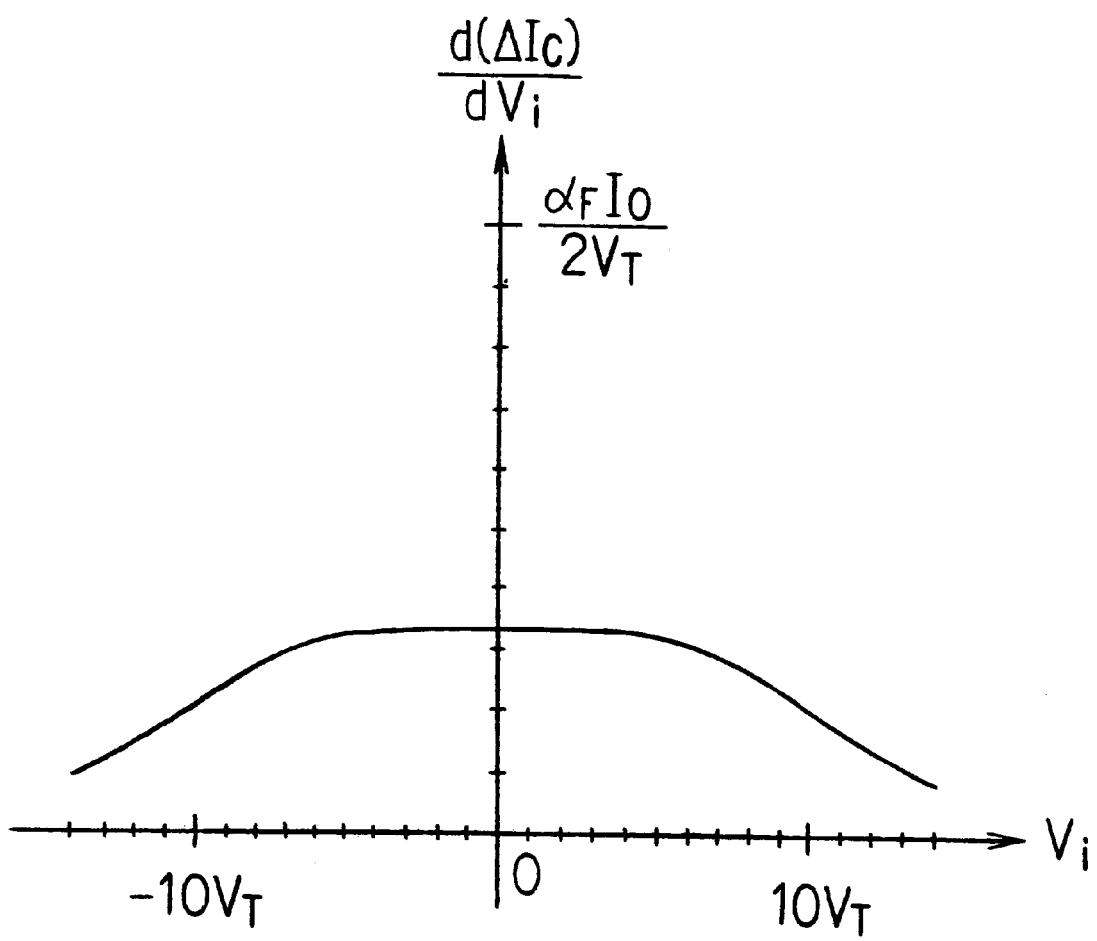
FIG. 13 is a graph showing the transconductance characteristic of the bipolar OTA according to the fourth embodiment of the present invention.

A measured transconductance characteristic for the quadritail cell of FIG. 11 is shown in FIG. 13. The abscissa axis of FIG. 13 indicates the normalized differential input voltage $V_i$ by $V_T$.

It is seen from FIGS. 13 that a realizable input voltage range providing the transconductance whose linearity is kept within a $\pm 1\%$ error is approximately 200 $\text{mV}_{P-P}$.

Comparing the equations (29) and (12), it is seen that the denominator of the differential output current $\Delta I$ of the OTA according to the fourth embodiment is expressed by a sum of hyperbolic cosine functions and that each of the coefficients of these hyperbolic cosine functions is expressed by a natural number Therefore, similar to the OTA of the third embodiment of FIG. 8, the transconductance linearity can be obtained in the OTA according to the fourth embodiment also.

Fifth Embodiment

Figure 14:
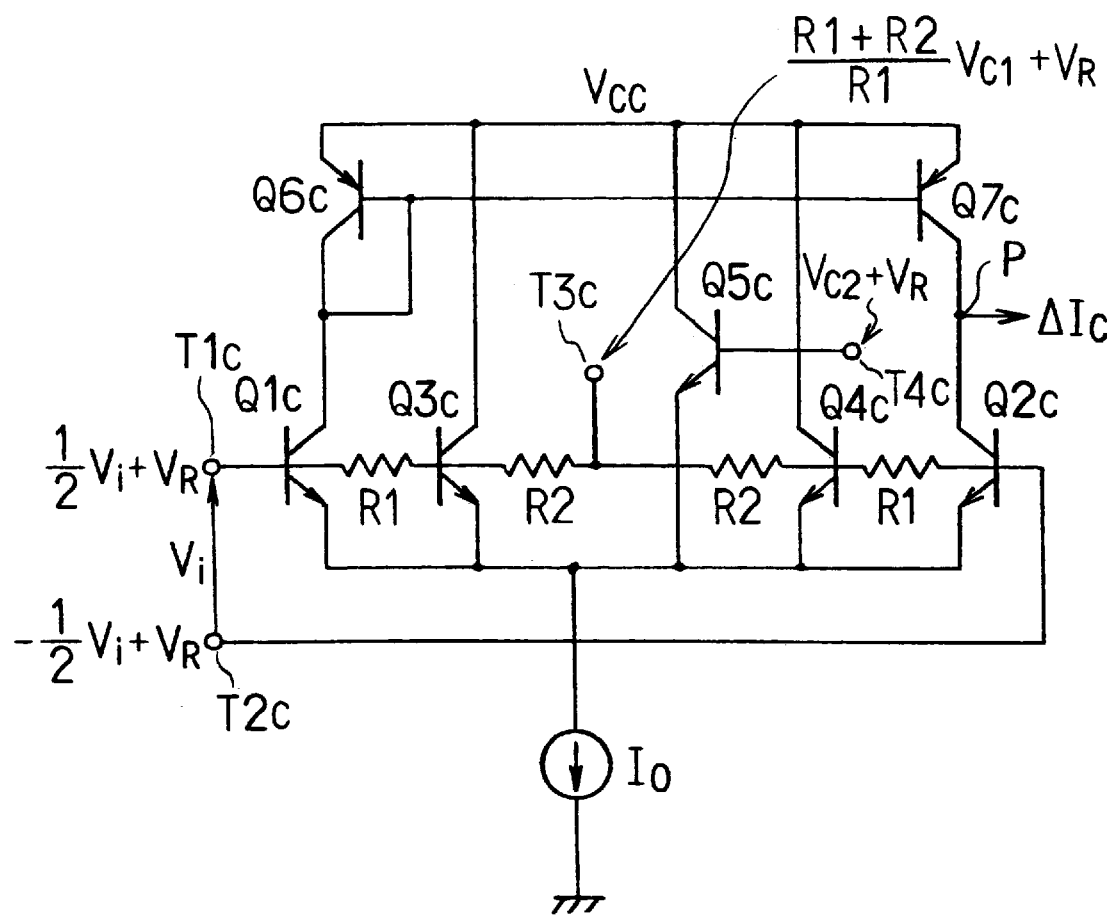
FIG. 14 is a circuit diagram of a bipolar OTA according to a fifth embodiment of the present invention.

A bipolar OTA according to a fifth embodiment of the present invention is shown in FIG. 14, which corresponds to an OTA obtained by setting n=2 (i.e., 2n+1=5) in the OTA according to the second embodiment of FIG. 7. This configuration is termed a "quint-tail cell".

As shown in FIG. 14, this OTA includes a first balanced differential pair of npn bipolar transistors Q1c and Q2c whose emitters are coupled together, a second balanced differential pair of npn bipolar transistors Q3c and Q4c whose emitters are coupled together, an npn bipolar transistor Q5c whose emitter is connected to the coupled emitters of the transistors Q1c, Q2c, Q3c and Q4c, and a common constant current sink (current: $I_0$) for driving the transistors Q1c, Q2c, Q3c, Q4c and Q5c. The emitters of the fifth transistors Q1c, Q2c, Q3c, Q4c and Q5c are connected in common to one end of the current sink. The other end of the current sink is grounded.

The emitter areas of the transistors Q1c, Q2c, Q3c, Q4c and Q5c are equal to that of a unit bipolar transistor.

The bases of the transistors Q1c and Q2c are connected to a pair of input terminals T1c and T2c, respectively. The base of the transistor Q1c is applied with a voltage of $[(\frac{1}{2})V_i+V_R]$ through the input terminal T1c, and the base of the transistor Q2c is applied with a voltage of $[(-\frac{1}{2})V_i+V_R]$ through the input terminal T2c, where $V_R$ is a dc reference voltage. Therefore, a differential input voltage $V_1$ as an input signal to be amplified is applied across the bases of the transistors Q1c and Q2c, which is the same as that of the third embodiment of FIG. 8.

The base of the transistor Q3c is connected to the base of the transistor Q1c and the input terminal T1c through a first resistor (resistance: R1). The base of the transistor Q4c is connected to the base of the transistor Q2c and the input terminal T2c through a second resistor (resistance: R1). Therefore, a differential input voltage ($V_i/d_2$) attenuated by the first and second resistors is applied across the bases of the transistors Q3c and Q4c.

The base of the transistor Q3c is further connected to an input terminal T3c through a third resistor (resistance: R2). The base of the transistor Q4c is further connected to the input terminal T3c through a fourth resistor (resistance: R2).

The input terminal T3c is applied with a dc voltage of $[\{(R1+R2)/R1\}V_{C1}+V_R]$, where $V_{C1}$ is a dc tuning voltage.

Collectors of the transistors Q3c and Q4c are applied with a power supply voltage $V_{CC}$.

The same dc voltage $V_2$ shown in FIG. 7, which is generated by the first to fourth resistors, is additionally applied to the bases of the transistors Q3c and Q4c, respectively.

A base of the transistor Q5c is connected to an input terminal T4c. The input terminal T4c is applied with a dc voltage of $(V_{C2}+V_R)$, where $V_{C2}$ is a dc tuning voltage. A collector of the transistor Q5c is applied with the power supply voltage $V_{CC}$.

A current mirror circuit composed of pnp base-coupled bipolar transistors Q6c and Q7c is provided between a power supply (supply voltage: $V_{CC}$, not shown) and collectors of the transistors Q1c and Q2c. The current mirror circuit serves as an active load of the first differential pair.

A collector and a base of the transistor Q6c are coupled together to be connected to a collector of the transistor Q1c, and an emitter thereof is applied with the supply voltage $V_{CC}$. A collector of the transistor Q7c is connected to a collector of the transistor Q2c and an emitter thereof is applied with the supply voltage $V_{CC}$.

A differential output current $\Delta I$ of the OTA as an amplified output signal is derived from the connection point of the collectors of the transistors Q7c and Q2c. The differential output current $\Delta I$ is defined as $\Delta I = I_{C1} - I_{C2}$, where $I_{C1}$ and $I_{C2}$ are collector currents of the transistors Q1c and Q2c, respectively.

Then, the differential output current $\Delta I$ of the OTA according to the fifth embodiment of FIG. 14 is given by setting n=2 in the equation (22b).

Here, the resistance values R1 and R2 are set so that the attenuation parameter $d_2$ satisfies the relationship of $(1/d_2)$= 0.3448, (i.e., R2=0.5263 R1). Also, the supply voltage $V_{CC}$ is set as $V_{CC}$=1 V, the dc offset voltage $V_2$ is set as $V_2$=1.68 $V_T \approx 42.4$ mV, the sum of the voltage $V_{C2}$ and $V_R$ is set as $V_{C2}+V_R \approx 1.96$ $V_T \approx 49.0$ mV, and the dc tuning voltages $V_{C1}$ and $V_{C2}$ are set as $V_{C1}$=42.4 mV and $V_{C2}$=53.0 mV. So, a realizable input voltage range providing the transconductance whose linearity is kept within a ±1% error is approximately 500 $mV_{P-P}$.

Sixth Embodiment

Figure 15:
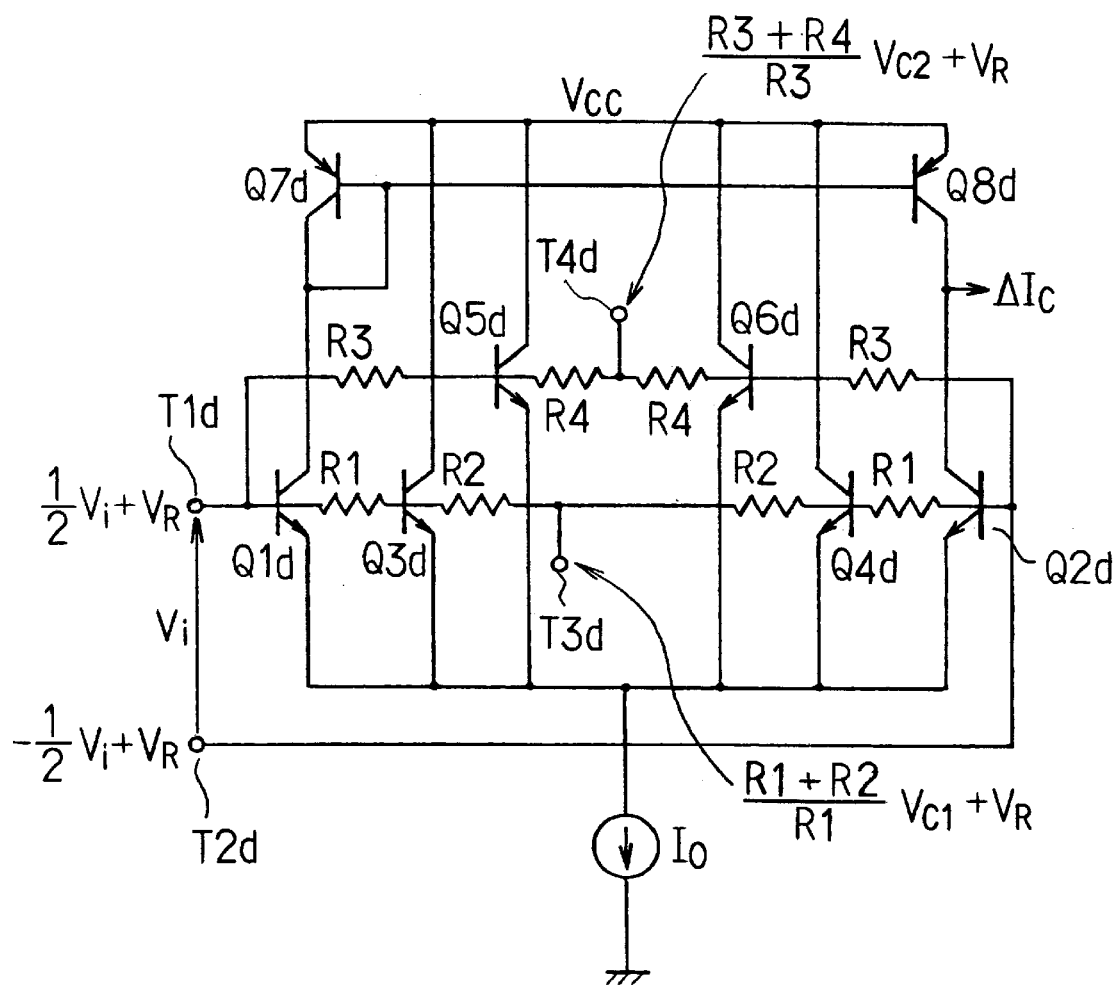
FIG. 15 is a circuit diagram of a bipolar OTA according to a sixth embodiment of the present invention.

A bipolar OTA according to a sixth embodiment of the present invention is shown in FIG. 15, which corresponds to an OTA obtained by setting n=3 (i.e., 2n=6) in the OTA according to the first embodiment of FIG. 6. This configuration is termed a "hexatail cell".

As shown in FIG. 15, this OTA includes a first balanced differential pair of npn bipolar transistors Q1d and Q2d whose emitters are coupled together, a second balanced differential pair of npn bipolar transistors Q3d and Q4d whose emitters are coupled together, a third balanced differential pair of npn bipolar transistors Q5d and Q6d whose emitters are coupled together, and a common constant current sink (current: $I_0$) for driving the transistors Q1d, Q2d, Q3d, Q4d, Q5d and Q6d. The emitters of the six transistors Q1d, Q2d, Q3d, Q4d, Q5d and Q6d are connected in common to one end of the current sink. The other end of the current sink is grounded.

The emitter areas of the transistors Q1d, Q2d, Q3d, Q4d, Q5d and Q6d are equal to that of a unit bipolar transistor.

The bases of the transistors Q1d and Q2d are connected to a pair of input terminals T1d and T2d, respectively. The base of the transistor Q1d is applied with a voltage of $[(\frac{1}{2})V_i+V_R]$ through the input terminal T1d, and the base of the transistor Q2d is applied with a voltage of $[(-\frac{1}{2})V_i+V_R]$ through the input terminal T2d, where $V_R$ is a dc reference voltage. Therefore, a differential input voltage $V_i$ as an input signal to be amplified is applied across the pair of input terminals T1d and T2d.

The base of the transistor Q3d is connected to the base of the transistor Q1d and the input terminal T1d through a first resistor (resistance: R1). The base of the transistor Q4d is connected to the base of the transistor Q2d and the input terminal T2d through a second resistor (resistance: R1). Therefore, a differential input voltage $(V_i/d_2)$ attenuated by the first and second resistors is applied across the bases of the transistors Q3d and Q4d.

The base of the transistor Q3d is further connected to an input terminal T3d through a third resistor (resistance: R2) he The base of the transistor Q4d is further connected to the input terminal T3d through a fourth resistor (resistance: R2).

The input terminal T3d is applied with a dc voltage of $[\{(R1+R2)/R1\}V_{C1}+V_R]$, where $V_{C1}$ is a dc tuning voltage. Collectors of the transistors Q3d and Q4d are applied with a power supply voltage $V_{CC}$.

The same dc voltage $V_2$ shown in FIG. 6, which is generated by the first and second resistors, is additionally applied to the bases of the transistors Q3d and Q4d, respectively.

The base of the transistor Q5d is connected to the input terminal T1d through a fifth resistor (resistance: R3). The base of the transistor Q6d is connected to the input terminal T2d through a sixth resistor (resistance: R3). Therefore, a differential input voltage $(V_1/d_3)$ attenuated by the third and fourth resistors is applied across the bases of the transistors Q5d and Q6d.

The base of the transistor Q5d is further connected to an input terminal T4d through a seventh resistor (resistance: R4). The base of the transistor Q6d is further connected to the input, terminal T4d through an eighth resistor (resistance: R4).

The input terminal T4d is applied with a dc voltage of $[\{(R3+R4)/R3\}V_{C2}+V_R]$, where $V_{C2}$ is a tuning voltage. Collectors of the transistors Q5d and Q6d are applied with a power supply voltage $V_{CC}$.

The same dc voltage $V_3$, which is generated by the fifth to eighth resistors, is additionally applied to the bases of the transistors Q5d and Q6d, respectively.

A current mirror circuit composed of pnp base-coupled bipolar transistors Q7d and Q8d is provided between a power supply (supply voltage: $V_{CC}$, not shown) and collectors of the transistors Q1d and Q2d. The current mirror circuit serves as an active load of the differential pair.

A collector and a base of the transistor Q7d are coupled together to be connected to a collector of the transistor Q1d, and an emitter thereof is applied with the supply voltage $V_{CC}$. A collector of the transistor Q8d is connected to a collector of the transistor Q2d and an emitter thereof is applied with the supply voltage $V_{CC}$.

A differential output current $\Delta I$ of the OTA as an amplified output signal is derived from the connection point of the collectors of the transistors Q8d and Q2d. The differential output current $\Delta I$ is defined as $\Delta I = I_{C1} - I_{C2}$, where $I_{C1}$ and $I_{C2}$ are collector currents of the transistors Q1d and Q2d, respectively.

Then, the differential output current $\Delta I$ of the OTA according to the sixth embodiment of FIG. 15 is given by setting n=3 in the equation (22a).

Here, the resistance values R1 and R2 are set so that the attenuation parameters $d_2$ and $d_3$ satisfy the relationships of $(1/d_2)=0.7619$ (i.e., R2=3.20 R1) and $(1/d_3)=0.2857$ (i.e., R4=0.40 R3). Also, the supply voltage $V_{CC}$ is set as $V_{CC}=1$ V, the dc offset voltages $V_2$ and $V_3$ are set as $V_2=1.74$ $V_T \approx 43.4$ mV and $V_3=2.12$ $V_T \approx 53.0$ mV. The dc tuning voltages $V_{C1}$ and $V_{C2}$ are set as $V_{C1}=42.4$ mV and $V_{C2}=53.0$ mV. So, a realizable input voltage range providing the transconductance whose linearity is kept within a ±1% error is approximately 800 $mV_{P-P}$.

Seventh Embodiment

Figure 16:
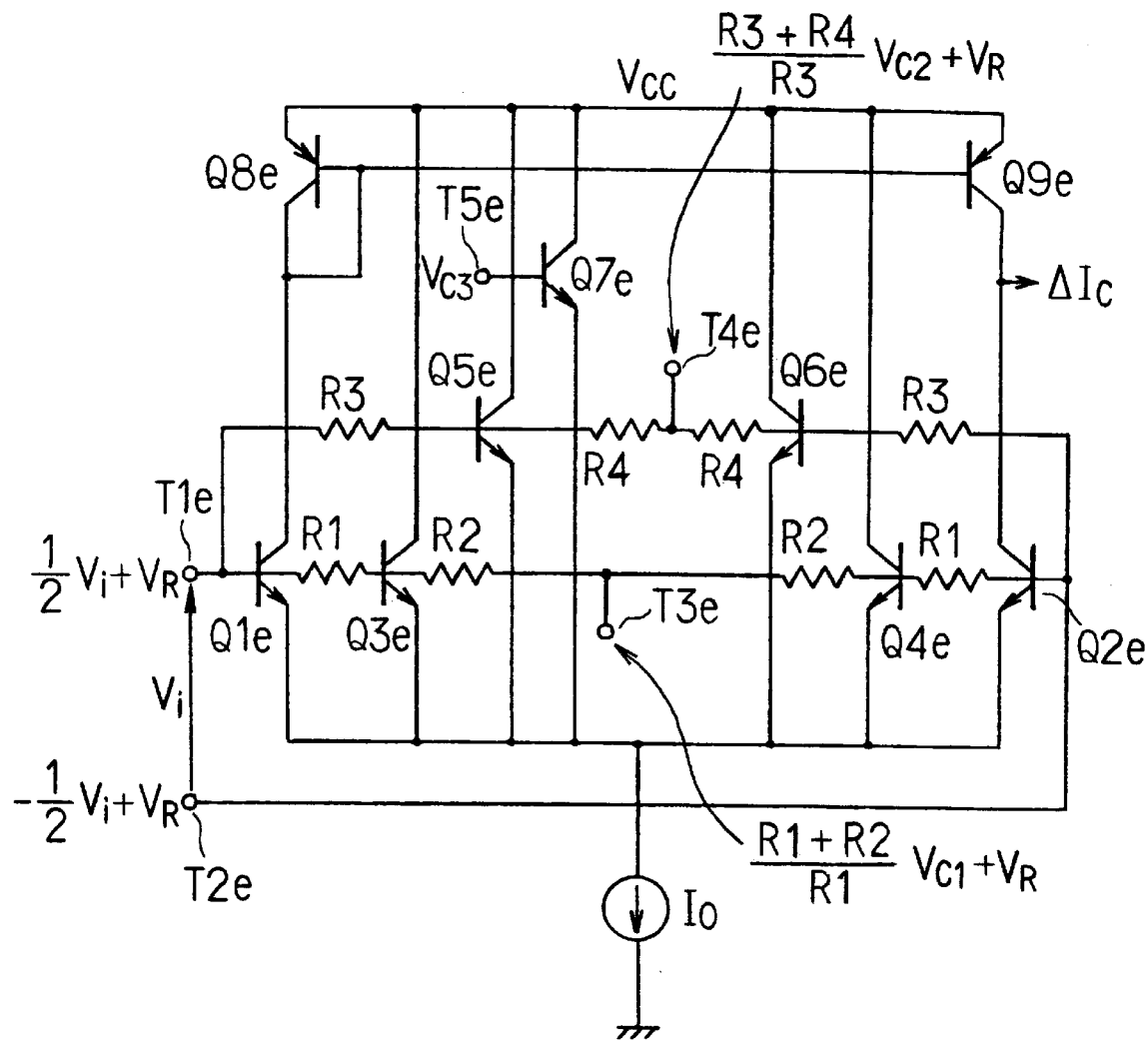
FIG. 16 is a circuit diagram of a bipolar OTA according to a seventh embodiment of the present invention.

A bipolar OTA according to a seventh embodiment of the present invention is shown in FIG. 16, which corresponds to an OTA obtained by setting n=3 (i e., 2n+1=7) in the OTA according to the second embodiment of FIG. 7. This configuration is termed a "septtail cell".

As shown in FIG. 16, this OTA includes a first balanced differential pair of npn bipolar transistors Q1e and Q2e whose emitters are coupled together, a second balanced differential pair of npn bipolar transistors Q3e and Q4e whose emitters are coupled together, a third balanced differential pair of npn bipolar transistors Q5e and Q6e whose emitters are coupled. together, an npn bipolar transistor Q7e, and a common constant current sink (current: $I_0$) for driving the transistors Q1e, Q2e, Q3e, Q4e, Q5e, Q6e and Q7e. The emitters of the seven transistors Q1e, Q2e, Q3e, Q4e, Q5e, Q6e and Q7e are connected in common to one end of the current sink. The other end of the current sink is grounded.

The emitter areas of the transistors Q1e, Q2e, Q3e, Q4e, Q5e, Q6e and Q7e are equal to that of a unit bipolar transistor.

The bases of the transistors Q1e and Q2e are connected to a pair of input terminals T1e and T2e, respectively. The base of the transistor Q1e is applied with a voltage of $[(½)V_i+V_R]$ through the input terminal T1d, and the base of the transistor Q2e is applied with a voltage of $[(-½)V_i+V_R]$ through the input terminal T2e, where $V_R$ is a dc reference voltage. Therefore, a differential input voltage $V_i$ as an input signal to be amplified is applied across the bases of the transistors Q1e and Q2e through the pair of input terminals T1e and T2e.

The base of the transistor Q3e is connected to the base of the transistor Q1e and the input terminal T1e through a first resistor (resistance: R1). The base of the transistor Q4e is connected to the base of the transistor Q2e and the input terminal T2e through a second resistor (resistance: R1). Therefore, a differential input voltage ($V_i/d_2$) attenuated by the first and second resistors is applied across the bases of the transistors Q3e and Q4e.

The base of the transistor Q3e is further connected to an input terminal T3e through a third resistor (resistance: R2). The base of the transistor Q4e is further connected to the input terminal T3e through a fourth resistor (resistance: R2).

The input terminal T3e is applied with a dc voltage of $[\{(R1+R2)/R1\}V_{C1}+V_R]$, where $V_{C1}$ is a tuning voltage. Collectors of the transistors Q3e and Q4e are applied with a power supply voltage $V_{CC}$.

The same dc voltage $V_2$ shown in FIG. 7, which is generated by the first to fourth resistors, is additionally applied to the bases of the transistors Q3e and Q4e, respectively.

The base of the transistor Q5e is connected to the input terminal T1e through a fifth resistor (resistance: R3). The base of the transistor Q6e is connected to the input terminal T2e through a sixth resistor (resistance: R3). Therefore, a differential input voltage ($V_i/d_3$) attenuated by the third and fourth resistors is applied across the bases of the transistors Q5e and Q6e.

The base of the transistor Q5e is further connected to an input terminal T4e through a seventh resistor (resistance: R4) The base of the transistor Q6e is further connected to the input terminal T4e through an eighth resistor (resistance: R4)

The input terminal T4e is applied with a dc voltage of $[\{(R3+R4)/R3\}V_{C2}+V_R]$, where $V_{C2}$ is a tuning voltage. Collectors of the transistors Q5e and Q6e are applied with a power supply voltage $V_{CC}$.

The same dc voltage $V_3$, which is generated by the fifth to eighth resistors, is additionally applied to the bases of the transistors Q5e and Q6e, respectively.

A base of the transistor Q7e is connected to an input terminal T5e. The input terminal T5e is applied with a dc voltage of $V_{C3}$ where $V_{C3}$ is a dc tuning voltage. A collector of the transistor Q7e is applied with the power supply voltage $V_{CC}$.

A current mirror circuit composed of pnp base-coupled bipolar transistors Q8e and Q9e is provided between a power supply (supply voltage: $V_{CC}$, not shown) and collectors of the transistors Q1e and Q2e. The current mirror circuit serves as an active load of the differential pair.

A collector and a base of the transistor Q8e are coupled together to be connected to a collector of the transistor Q1e, and an emitter thereof is applied with the supply voltage $V_{CC}$. A collector of the transistor Q9e is connected to a collector of the transistor Q2e and an emitter thereof is applied with the supply voltage $V_{CC}$.

A differential output current $\Delta I$ of the OTA as an amplified output signal is derived from the connection point of the collectors of the transistors Q9e and Q2e. The differential output current $\Delta I$ Is defined as $\Delta I=I_{C1}-I_{C2}$, where $I_{C1}$ and $I_{C2}$ are collector currents of the transistors Q1e and Q2e, respectively.

Then, the differential output current $\Delta I$ of the OTA according to the seventh embodiment of FIG. 16 is given by setting n=3 in the equation (22b).

Here, the resistance values R1 and R2 are set so that the attenuation parameters $d_2$ and $d_3$ satisfy the relationships of $(1d_2)=0.830$ (i.e., R2=4.8824 R1) and $(1d_3)=0.470$ (i.e., R4=0.8868 R3). Also, the supply voltage $V_{CC}$ is set as $V_{CC}=1$ V, and the dc offset voltages $V_2$ and $V_3$ are set as $V_2=V_T \cdot \ln 6 \approx 1.792$ $V_r$ 44.8 mV. The dc tuning voltages $V_{C1}$, $V_{C2}$ and $C_{C3}$ are set as $V_{C1}=42.4$ mV, $V_{C2}=53.0$ mV, and $V_{C3}=V_T \cdot \ln 10 \approx 2.3026$ $V_r \approx 57.6$ mV. So, a realizable input voltage range providing the transconductance whose linearity is kept within a ±1% error is approximately 1100 $mV_{P-P}$.

In the bipolar OTAs according to the first to seventh embodiments of the present invention, npn bipolar transistors are used as each of the differential pairs and the additional transistor. However, it is needless to say that pnp bipolar transistors may be used.

In the above third to seventh embodiments, although the number n is set as 1, 2 and 3, it may be 4 or more, as necessary.

While the preferred forms of the present invention have been described, it is to be understood that modifications will be apparent to those skilled in the art without departing from the spirit of the invention. The scope of the invention, therefore, is to be determined solely by the following claims

What is claimed is:

1. A bipolar operational transconductance amplifier comprising:

a first differential pair of first and second bipolar transistors whose emitters are coupled together;

a second differential pair of third and fourth bipolar transistors whose emitters are coupled together;

a common current source or sink connected to said emitters of said first and second bipolar transistors and said emitters of said third and fourth bipolar transistors;

said first, second, third and fourth bipolar transistors being driven by a common tail current produced by said common current source or sink;

a first input terminal connected to a base of said first bipolar transistor;

a second input terminal connected to a base of said second bipolar transistor;

a first input voltage as an input signal to be amplified being differentially applied across said first and second input terminals;

a third input terminal connected to a base of said third bipolar transistor;

a fourth input terminal connected to a base of said fourth bipolar transistor;

a second input voltage being differentially applied across said third and fourth input terminals, said second input voltage being produced by attenuating said first input voltage;

first and second dc offset voltages being applied to said third and fourth input terminals, respectively; and said bipolar transistors having equal emitter areas;

wherein an output current as an amplified output signal is differentially derived from collectors of said first and second bipolar transistors.

2. An amplifier as claimed in claim 1, wherein said second input voltage is generated by using a resistive voltage divider.

3. An amplifier as claimed in claim 1, further comprising:

a first resistor connected to said bases of said first and third transistors;

a second resistor connected to said bases of said second and fourth transistors;

a fifth input terminal;

a third resistor connected to said base of said third transistor and said fifth input terminal; and a fourth resistor connected to said base of said fourth transistor and said fifth input terminal;

wherein said base of said third transistor serves as said third input terminal and said base of said fourth transistor serves as said fourth input terminal;

and wherein a dc voltage having a dc tuning voltage component is applied to said fifth input terminal to generate said second input voltage in corporation with said first, second, third and fourth resistors.

4. An amplifier as claimed in claim 3, wherein said first, second, third and fourth bipolar transistors constitute a quadritail cell;

and wherein said second input voltage is $(1/\sqrt{5})$ times as much as said first input voltage;

and wherein said first and second dc voltages are equal to $(V_T \cdot \ln 5)$, where $V_T$ is the thermal voltage.

5. An amplifier as claimed in claim 3, wherein said first, second, third and fourth bipolar transistors constitute a quadritail cell;

and wherein said first and second resistors have a same resistance value R1 and said third and fourth resistors have a same resistance value R2, where $R2=R1/(\sqrt{5}-1)$.

6. An amplifier as claimed in claim 1, further comprising a third differential pair of fifth and sixth bipolar transistors whose emitters are coupled together to be connected to said common current source or sink;

said fifth and sixth bipolar transistors being driven by said common tail current;

a first resistor connected to said bases of said first and third transistors;

a second resistor connected to said bases of said second and fourth transistors;

a fifth input terminal;

a third resistor connected to said base of said third transistor and said fifth input terminal; and a fourth resistor connected to said base of said fourth transistor and said fifth input terminal;

a fifth resistor connected to said base of said fifth transistor and said first input terminal;

a sixth resistor connected to said base of said sixth transistor and said second input terminal;

a sixth input terminal;

a seventh resistor connected to said base of said fifth transistor and said sixth input terminal; and an eighth resistor connected to said base of said sixth transistor and said sixth input terminal;

wherein said base of said third transistor serves as said third input terminal and said base of said fourth transistor serves as said fourth input terminal;

and wherein a third input voltage is differentially applied across said bases of said fifth and sixth transistors, said third input voltage being produced by attenuating said first input voltage;

and wherein a first dc voltage is applied to said fifth input terminal to generate said second input voltage in corporation with said first, second, third and fourth resistors;

and wherein a second dc voltage is applied to said sixth input terminal to generate said third input voltage in corporation with said fifth, sixth, seventh and eighth resistors.

7. An amplifier as claimed in claim 6, wherein said first, second, third, fourth, fifth and sixth bipolar transistors constitute a hexatail cell;

and wherein said second input voltage is approximately 0.7619 times as much as said first input voltage;

and wherein said third input voltage is approximately 0.2857 times as much as said first input voltage.

8. An amplifier as claimed in claim 6, wherein said first, second, third, fourth, fifth and sixth bipolar transistors constitute a hexatail cell;

and wherein said first and second resistors have a same resistance value R1 and said third and fourth resistors have a same resistance value R2, where R2=3.20 R1;

and wherein said fifth and sixth resistors have a same resistance value R3 and said seventh and eighth resistors have a same resistance value R4, where R4=0.40 R3.

9. An amplifier as claimed in claim 1, wherein when said first input voltage is defined as $V_i$ and a dc reference voltage is defined as $V_R$, a voltage of $[+(½)V_i+V_R]$ is applied to said first input terminal and a voltage of $[-(½)V_i+V_R]$ is applied to said second input terminal.

10. A bipolar operational transconductance amplifier comprising:

a first differential pair of first and second bipolar transistors whose emitters are coupled together;

a third bipolar transistor whose emitter is connected to said emitters of said first and second transistors;

a common current source or sink connected to the emitters of the first, second and third bipolar transistors;

said first, second and third bipolar transistors being driven by a common tail current produced by said common current source or sink;

a first input terminal connected to a base of the first bipolar transistor;

a second input terminal connected to a base of the second bipolar transistor; said bipolar transistors having equal emitter areas; and a first voltage as an input signal to be amplified being differentially applied across said first and second input terminals;

a third input terminal connected to a base of said third bipolar transistor; and a constant dc voltage having a dc tuning voltage component applied to said third input terminal;

wherein an output current as an amplified output signal is differentially derived from collectors of said first and second bipolar transistors.

11. An amplifier as claimed in claim 10, wherein said first input voltage is generated by using a resistive voltage divider.

12. An amplifier as claimed in claim 10, wherein said first, second and third bipolar transistors constitute a triple-tail cell;

and wherein said dc voltage is equal to $(V_T \cdot \ln 4)$, where $V_T$ is the thermal voltage.

13. An amplifier as claimed in claim 10, further comprising a second differential pair of fourth and fifth bipolar transistors whose emitters are coupled together to be connected to said constant current source or sink, said second differential pair being driven by said common tail current;

a fourth input terminal connected to a base of said fourth bipolar transistor; and a fifth input terminal connected to a base of said fifth bipolar transistor;

wherein a second input voltage is differentially applied across said fourth and fifth input terminals;

and wherein said second input voltage is produced by attenuating said first input voltage.

14. An amplifier as claimed in claim 13, wherein said second input voltage is generated by using a resistive voltage divider.

15. An amplifier as claimed in claim 13, wherein said first, second, third, fourth and fifth bipolar transistors constitute a quint-tail cell;

and wherein said second input voltage is approximately 0.3448 times as much as said first input voltage.

16. An amplifier as claimed in claim 10, wherein when said first input voltage is defined as $V_i$ and a dc reference voltage is defined as $V_R$, a voltage of $[(+\frac{1}{2})V_i + V_R]$ is applied to said first input terminal and a voltage of $[-(\frac{1}{2})V_i + V_R]$ is applied to said second input terminal.

17. An amplifier as claimed in claim 13, further comprising:

a first resistor connected to said bases of said first and fifth transistors;

a second resistor connected to said bases of said second and fourth transistors;

a sixth input terminal;

a third resistor connected to said base of said fifth transistor and said sixth input terminal; and a fourth resistor connected to said base of said fourth transistor and said sixth input terminal.

18. An amplifier as claimed in claim 17, wherein said first, second, third, fourth and fifth bipolar transistors constitute a quint-tail cell;

and wherein said first and second resistors have a same resistance value R1 and said third and fourth resistors have a same resistance value R2, where R2=0.5263 R1.

19. A bipolar operational transconductance amplifier comprising:

a first differential pair of first and second bipolar transistors whose emitters are coupled together;

a second differential pair of third and fourth bipolar transistors whose emitters are coupled together;

a fifth bipolar transistor whose emitter is connected to said emitters of said first and second transistors;

a common current source or sink connected to said emitters of said first, second, third, fourth and fifth bipolar transistors;

said first, second, third, fourth and fifth bipolar transistors being driven by a common tail current produced by said common current source or sink;

a first input terminal connected to a base of said first bipolar transistor;

a second input terminal connected to a base of said second bipolar transistor;

a first input voltage as an input signal to be amplified being differentially applied across said first and second input terminals;

a third input terminal connected to a base of said third bipolar transistor;

a fourth input terminal connected to a base of said fourth bipolar transistor;

a second input voltage being differentially applied across said third and fourth input terminals, said second input voltage being produced by attenuating said first input voltage;

a fifth input terminal connected to a base of said fifth bipolar transistor; said bipolar transistors having equal emitter areas; and a first dc voltage being applied to said fifth input terminal;

wherein an output current as an amplified output signal is differentially derived from collectors of said first and second bipolar transistors.

20. An amplifier as claimed in claim 19, wherein said second input voltage is generated by using a resistive voltage divider.

21. An amplifier as claimed in claim 19, further comprising a first resistor connected to said bases of said first and third transistors;

a second resistor connected to said bases of said second and fourth transistors;

a sixth input terminal;

a third resistor connected to said base of said third transistor and said sixth input terminal; and a fourth resistor connected to said base of said fourth transistor and said sixth input terminal;

wherein said base of said third transistor serves as said third input terminal and said base of said fourth transistor serves as said fourth input terminal;

and wherein a second dc voltage is applied to said sixth input terminal to generate said second input voltage in corporation with said first, second, third and fourth resistors.

22. An amplifier as claimed in claim 21, wherein said first, second, third, fourth and fifth bipolar transistors constitute a quint-tail cell;

and wherein said second input voltage is approximately 0.3448 times as much as said first input voltage.

23. An amplifier as claimed in claim 21, wherein said first, second, third, fourth and fifth bipolar transistors constitute a quint-tail cell;

and wherein said first and second resistors have a same resistance value R1 and said third and fourth resistors have a same resistance value R2, where R2=0.5263 R1.

24. An amplifier as claimed in claim 19, further comprising a third differential pair of sixth and seventh bipolar transistors whose emitters are coupled together to be connected to said common current source or sink;

said sixth and seventh bipolar transistors being driven by said common tail current;

a first resistor connected to said bases of said first and third transistors;

a second resistor connected to said bases of said second and fourth transistors;

a sixth input terminal;

a third resistor connected to said base of said third transistor and said sixth input terminal; and a fourth resistor connected to said base of said fourth transistor and said sixth input terminal;

a fifth resistor connected to said base of said sixth transistor and said first input terminal;

a sixth resistor connected to said base of said seventh transistor and said second input terminal;

a seventh input terminal;

a seventh resistor connected to said base of said sixth transistor and said seventh input terminal; and an eighth resistor connected to said base of said eighth transistor and said seventh input terminal;

wherein said base of said third transistor serves as said third input terminal and said base of said fourth transistor serves as said fourth input terminal;

and wherein a third input voltage is differentially applied across said bases of said sixth and seventh transistors, said third input voltage being produced by attenuating said first input voltage;

and wherein a second dc voltage is applied to said sixth input terminal to generate said second input voltage in corporation with said first, second, third and fourth resistors;

and wherein a third dc voltage is applied to said seventh input terminal to generate said third input voltage in corporation with said fifth, sixth, seventh and eighth resistors.

25. An amplifier as claimed in claim 24, wherein said first, second, third, fourth, fifth, sixth and seventh bipolar transistors constitute a septtail cell;

and wherein said second input voltage is approximately 0.830 times as much as said first input voltage;

and wherein said third input voltage is approximately 0.470 times as much as said first input voltage.

26. An amplifier as claimed in claim 24, wherein said first, second, third, fourth, fifth, sixth and seventh bipolar transistors constitute a septtail cell;

and wherein said first and second resistors have a same resistance value R1 and said third and fourth resistors have a same resistance value R2, where R2=4.8824 R1;

and wherein said fifth and sixth resistors have a same resistance value R3 and said seventh and eighth resistors have a same resistance value R4, where R4=0.8868 R3.

27. An amplifier as claimed in claim 19, wherein when said first input voltage is defined as $V_i$ and a dc reference voltage is defined as $V_R$, a voltage of $[+(½)V_i+V_R]$ is applied to said first input terminal and a voltage of $[-(½)V_i+V_R]$ is applied to said second input terminal.

28. A bipolar operational transconductance amplifier comprising:

first to n-th differential pairs of bipolar transistors whose emitters are coupled together, where n is an integer equal to or greater than two;

a common current source or sink connected to said emitters of said bipolar transistors of said first to n-th differential pairs; and said bipolar transistors of said first to n-th differential pairs being driven by a common tail current produced by said common current source or sink and having equal emitter areas;

wherein a first input voltage as an input signal to be amplified is differentially applied across bases of said bipolar transistors of said first differential pair;

and wherein second to n-th input voltages are differentially applied across corresponding bases of said bipolar transistors of said second to n-th differential pairs, respectively;

and wherein each of said second to n-th input voltages is produced by attenuating said first input voltage; and and wherein two dc offset voltages are applied to said respective bases of each of said second to n-th differential pairs;

and wherein an output current as an amplified output signal is differentially derived from collectors of said bipolar transistors of said first differential pair.

29. A bipolar operational transconductance amplifier comprising:

first to n-th differential pairs of bipolar transistors whose emitters are coupled together, where n is an integer equal to or greater than unity;

an additional bipolar transistor whose emitter is connected to said emitters of said bipolar transistors of said first to n-th differential pairs;

a common current source or sink connected to said emitters of said bipolar transistors of said first to n-th differential pairs and said emitter of said additional bipolar transistor; and said bipolar transistors of said first to n-th differential pairs and said additional bipolar transistor being driven by a common tail current produced by said common current source or sinks and having equal emitter areas;

wherein a first input voltage as an input signal to be amplified is differentially applied across bases of said bipolar transistors of said first differential pair;

and wherein second to n-th input voltages are differentially applied across corresponding bases of said bipolar transistors of said second to n-th differential pairs, respectively;

and wherein each of said second to n-th input voltages is produced by attenuating said first input voltage;

and wherein two dc offset voltages are applied to said respective bases of each of said second to n-th differential pairs;

and wherein a dc voltage being applied to said base of said additional bipolar transistor;

and wherein an output current as an amplified output signal is differentially derived from collectors of said bipolar transistors of said first differential pair.

* * * * *

UNITED STATES PATENT AND TRADEMARK OFFICE
CERTIFICATE OF CORRECTION

PATENT NO. : 5,933,054
DATED : August 3, 1999
INVENTOR(S) : Katsuji KIMURA

It is certified that error appears in the above-identified patent and that said Letters Patent is hereby corrected as shown below:

Column 8, line 31, delete "equation 19" and insert $$-\frac{\left\{2I_{01}\left(\left\{\cosh\left(\frac{V_{K1}}{V_T}\right)\right\}^2 - 13\cosh\left(\frac{V_{K1}}{V_T}\right) + 16\right)\right\}}{\left\{\cosh\left(\frac{V_{K1}}{V_T}\right) + 1\right\}^3} + \frac{\left\{2I_{02}\left(\left\{\cosh\left(\frac{V_{K2}}{V_T}\right)\right\}^2 - 13\cosh\left(\frac{V_{K2}}{V_T}\right) + 16\right)\right\}}{\left\{\cosh\left(\frac{V_{K2}}{V_T}\right) + 1\right\}^3} = 0$$

Signed and Sealed this

Twenty-third Day of May, 2000

Attest:

Q. TODD DICKINSON

*Attesting Officer*    *Director of Patents and Trademarks*